US009294097B1

(12) United States Patent
Vassiliev

(10) Patent No.: US 9,294,097 B1
(45) Date of Patent: Mar. 22, 2016

(54) DEVICE ARRAY TOPOLOGY CONFIGURATION AND SOURCE CODE PARTITIONING FOR DEVICE ARRAYS

(71) Applicant: Scientific Concepts International Corporation, Plano, TX (US)

(72) Inventor: Andrei V. Vassiliev, Plano, TX (US)

(73) Assignee: Scientific Concepts International Corporation, Plano, TX (US)

( * ) Notice: Subject to any disclaimer, the term of this patent is extended or adjusted under 35 U.S.C. 154(b) by 0 days.

(21) Appl. No.: 14/541,511

(22) Filed: Nov. 14, 2014

Related U.S. Application Data

(60) Provisional application No. 61/904,672, filed on Nov. 15, 2013, provisional application No. 61/925,030, filed on Jan. 8, 2014.

(51) Int. Cl.
 *H03K 19/177* (2006.01)
 *H03K 19/173* (2006.01)
 *G06F 17/50* (2006.01)

(52) U.S. Cl.
 CPC ...... *H03K 19/17704* (2013.01); *G06F 17/5072* (2013.01); *H03K 19/1776* (2013.01)

(58) Field of Classification Search
 CPC .................. H03K 19/17704; H03K 19/1776
 See application file for complete search history.

(56) References Cited

U.S. PATENT DOCUMENTS

| | | | | |
|---|---|---|---|---|
| 5,892,962 | A * | 4/1999 | Cloutier | 712/16 |
| 6,292,939 | B1 | 9/2001 | Itou et al. | |
| 7,080,365 | B2 | 7/2006 | Broughton et al. | |
| 7,568,085 | B2 | 7/2009 | Ramesh | |
| 7,587,699 | B2 | 9/2009 | McCubbrey | |
| 7,689,980 | B2 | 3/2010 | Du et al. | |
| 7,757,222 | B2 | 7/2010 | Liao et al. | |
| 8,296,746 | B2 | 10/2012 | Takayama et al. | |
| 8,543,993 | B2 | 9/2013 | Yamashita | |

(Continued)

FOREIGN PATENT DOCUMENTS

| | | |
|---|---|---|
| CN | 101989192 | 3/2011 |
| JP | H0573332 | 3/1993 |

OTHER PUBLICATIONS

Vivek Sarkar, Compile-time Partitioning and Scheduling of Parallel Programs, Article, SIGPLAN '86 Proceedings of the 1986 SIGPLAN symposium on Compiler Construction, Jul. 1986, pp. 17-26, vol. 21 Issue 7, New York, NY.

J.B. Peterson, Scheduling and Partitioning ANSI-C Programs onto Multi-FPGA CCM Architectures, FPGAs for Custom Computing Machines, Apr. 17, 1996, pp. 178-187, IEEE, Napa Valley, CA.

(Continued)

*Primary Examiner* — Jany Richardson
(74) *Attorney, Agent, or Firm* — Maschoff Brennan

(57) ABSTRACT

An array of field programmable gate array (FPGA) devices configured for execution of a source code. The array includes two or more FPGA devices, a host processor, and a host interface logic. The FPGA devices are configured to execute a parallelized portion of the source code partitioned among the FPGA devices based on data rates of computing elements of the source code, computational performance of the FPGA devices, the input/output (I/O) bandwidth of the FPGA devices. The FPGA devices include a memory bank addressable by a global memory address space for the array and an array interconnect that enables the computing elements executed by each of the FPGA devices to be programmed with a uniform address space of a global memory of the array and utilization of the global memory by the FPGA devices. The host interface logic connects the host processor with one of the FPGA devices.

21 Claims, 14 Drawing Sheets

(56) References Cited

U.S. PATENT DOCUMENTS

| | | |
|---|---|---|
| 8,595,712 B2 | 11/2013 | Komatsu et al. |
| 8,612,732 B2 | 12/2013 | Grover et al. |
| 8,799,880 B2 | 8/2014 | Martinez Canedo et al. |
| 2006/0184350 A1 | 8/2006 | Huang et al. |
| 2011/0231616 A1 | 9/2011 | Lin |
| 2014/0068581 A1 | 3/2014 | Chen et al. |

OTHER PUBLICATIONS

Mark Hachman, Microsoft, Baidu find speedier search results through specialized chips, PCWorld, Aug. 12, 2014, http://www.pcworld.com/article/2464260/microsoft-baidu-find-speedier-search-results-through-specialized-chips.html.

* cited by examiner

DEVICE ARRAY TOPOLOGY CONFIGURATION AND SOURCE CODE PARTITIONING FOR DEVICE ARRAYS

CROSS REFERENCE TO RELATED PATENT APPLICATIONS

This patent application claims priority to and the benefit of U.S. Provisional Applications Nos. 61/904,672 and 61/925,030, which are herein incorporated by reference in their entireties.

FIELD

The embodiments discussed herein are generally related to device array topology configuration and source code partitioning for the device arrays. In particular, some embodiments related to array topology configuration for arrays of field programmable gate array (FPGA) devices and source code partitioning for arrays of FPGA devices.

BACKGROUND

Heterogeneous computing and parallel code acceleration has been advancing for general purpose processors (GPPs), graphical processing units (GPUs), digital signal processors (DSPs), and field programmable gate array (FPGA) devices. These advances in heterogeneous computing and parallel code acceleration have led to development in parallel software languages such as OpenCL and CUDA. Some of the parallel software languages (e.g., OpenCL) are portable across one or more acceleration platforms while other (e.g., CUDA) are proprietary a type of GPUs. In addition, high level synthesis (HLS) for FPGA devices has advanced to enable creation of accelerated computing systems from C/C++ code. However, heterogeneous computing and parallel code acceleration is limited by hardware implementation in which such computing is performed.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, an array of field programmable gate array (FPGA) devices is configured for execution of a source code. The array includes two or more FPGA devices, a host processor, and a host interface logic. The FPGA devices are configured to execute a parallelized portion of the source code that is partitioned among the FPGA devices based on data rates of computing elements of the source code, computational performance of the FPGA devices, the input/output (I/O) bandwidth of the FPGA devices. Two or more of the FPGA devices include a memory bank that is addressable by a global memory address space for the array and includes an array interconnect configured to enable the computing elements that are executed by each of the FPGA devices to be programmed with a uniform address space of a global memory of the array and utilization of the global memory by each of the FPGA devices. The host interface logic is configured to connect the host processor with one or more of the FPGA devices.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
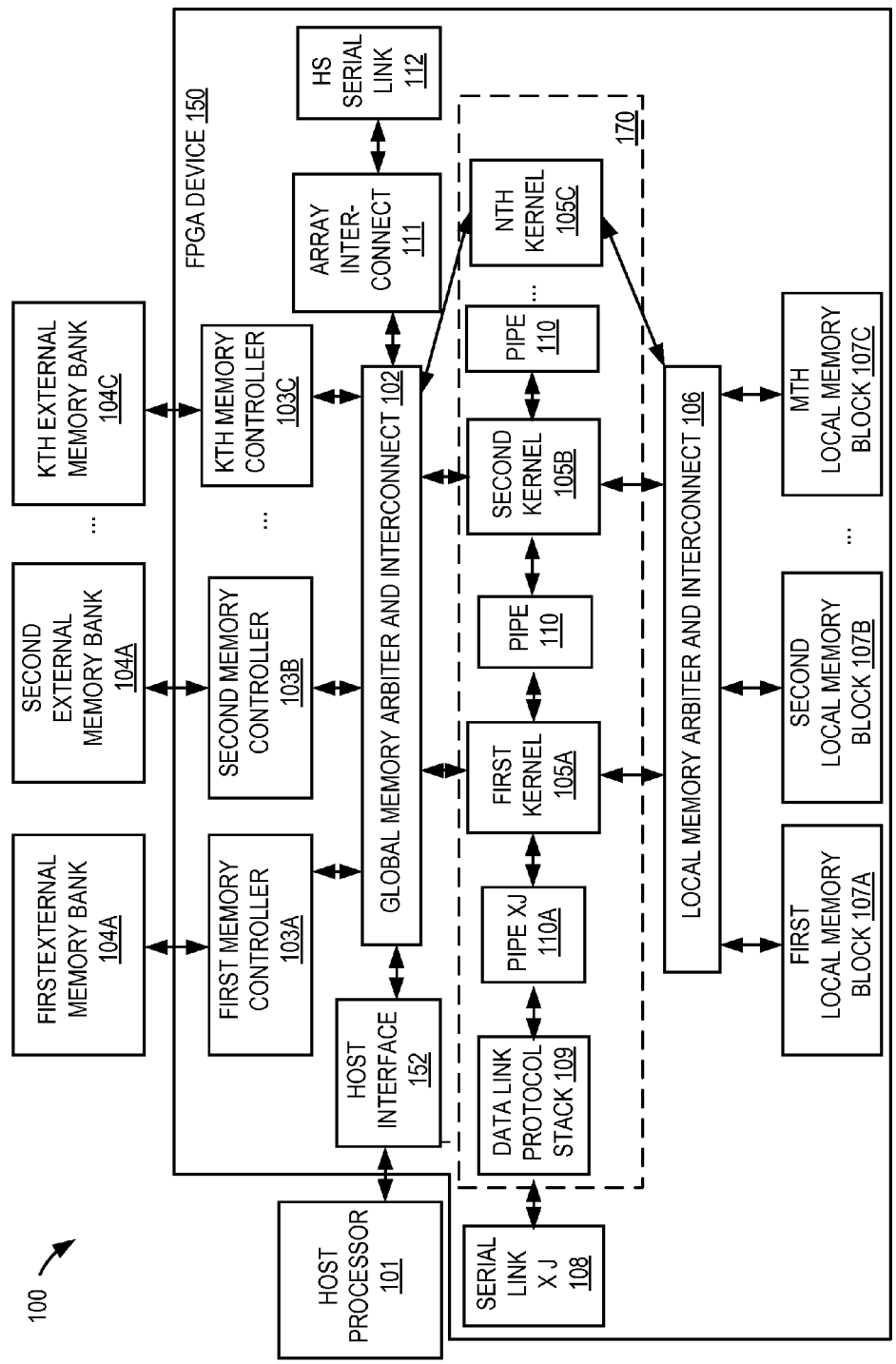
FIG. 1 illustrates an example FPGA device that may be implemented in heterogeneous computing system (system)

Heterogeneous systems are generally limited to a single field programmable gate array (FPGA) device. Although multiple parallel programs or kernels may be executing inside the FPGA device, which may provide significant acceleration comparable to a graphical processing unit (GPU), the performance of the heterogeneous system may be limited by a size of programmable logic fabric and finite dedicated resources of the single FPGA device. The limited performance of the single FPGA device may be undesirable for development of solutions to parallel tasks and applications that involve larger memory and faster parallel execution. Programmable logic devices such as FPGA devices are inherently free from the size limitations that may be present in semiconductor devices.

A GPU-based system can include several GPU units. However, these GPU units are generally connected by a proprietary scalable link interface (SLI) or a CrossFire interconnect. These GPU-based systems may be also limited by a maximum number of GPUs as determined by a vendor. The maximum number of GPUs may not be increased.

Accordingly, some embodiments described herein include multiple programmable logic devices such as FPGA devices (hereinafter "member devices" or "FPGA devices") implemented in heterogeneous computing systems. The heterogeneous computing systems may include, for instance, arrays of the devices. The arrays may include two-dimensional, three-dimensional, n-dimensional, or other array topologies such as cluster topologies. The arrays may include additional logic and an interconnect between the devices. The additional logic and the interconnect may expand global memory of each of the devices and maintain a unified address memory space or a unified kernel global memory address space for the array. The arrays may be configured according to a parallel programming task.

In some embodiments, the global memory address space may be expanded for a host processor that interfaces with the array. Accordingly, the array may operate with a shared virtual memory that includes external memory banks and/or local memory blocks of one or more the FPGA devices in the array.

A source code may be partitioned for parallel execution by the array. In some embodiments, a topology determining and source code partitioning module (topology/partitioning module) is implemented to partition the source code. The topology/partitioning module may include a code-in code-out type module that may be configured to convert a single code segment or original kernel code into a multiple code segments or segmented kernels to be executed by the individual member devices of the array. One or more of the code segments or the segmented kernels may then be compiled into a hardware circuit by a single device flow. In some embodiments, compiling the code segments or the segmented kernels may be accomplished as described in Desh Singh et al, Tutorial: Harnessing the Power of FPGA Using Alter's OpenCL Compiler, Altera, 2013 and Altera SDK for OpenCL Programming Guide, OCL002-13.1.0, 2013.11.04.

Some embodiments disclosed herein related to a tool that enables design of the arrays described above. The array may be designed based on one or more processing specifications and an optimal partitioning of a source code among member devices that may be included in the array.

In some embodiments, the topology/partitioning module may optimize a number of work items and a number of compute units for a particular source code. Using the optimized number of work items and/or compute units, an array configuration may be formulated. Specifically, the number of work items and a number of compute units may be optimized to maximize resource utilization of each device of the array. The topology/partitioning module may include an autonomous mode and an interactive mode with graphical user interface (GUI). These and other embodiments are described with reference to the appended drawings.

FIG. 1 illustrates an example FPGA device 150 that may be implemented in a heterogeneous computing system (system) 100. The system 100 generally includes the FPGA device 150, along with a host processor 101 and external memory banks 104A-104C (generally, external memory bank 104 or external memory banks 104). The FPGA device 150 may include a global memory arbiter and interconnect (global interconnect) 102. The global interconnect 102 may connect to a host interface 152, memory controllers 103A-103C (generally, memory controller 103 or memory controllers 103), and the array interconnect 111. Additionally, the FPGA device 150 may include a local memory arbiter and interconnect (local interconnect) 106. The local interconnect 106 may connect to local memory blocks 107A-107C (generally, local memory block 107 or local memory blocks 107).

The external memory banks 104 may be utilized during processes performed by or initiated by the host processor 101. Accordingly, the global interconnect 102 may enable the host processor 101 to access the external memory banks 104 via the host interface 152 and one or more memory controllers 103. Examples of the external memory banks 104 may include double data rate (DDR) memory banks, quad data rate (QDR) memory banks, or any other suitable memory bank.

The system 100 may execute a parallel portion of a source code, a portion of which is generally indicated by item number 170 and referred to as source code 170. Execution of the source code 170 may be performed by executing one or more kernels or groups of kernels 105A-105C (generally, kernel 105 or kernels 105) and/or one or more pipes 110A-110C (generally, pipe 110 or pipes 110). The kernels 105 may load data and store data to and from the external memory banks 104. Additionally, the kernels 105 may load data and store data to and from local memory blocks 107 via the local interconnect 106. The pipes 110 may be used to communicate data between the kernels 105. Additionally, the global interconnect 102 and the local interconnect 106 may have an arbitration logic that resolves the contentions during simultaneous access requests by the host processor 101, the kernels 105, and the array interconnect 111.

The array interconnect 111 and/or the high speed serial link 112 (in FIG. 1, HS serial links 112), enable access to external memory banks 104 and local memory blocks 107 of other FPGA devices and processes implemented by remote host processors. For example, in some embodiments, without the array interconnect 111 or high speed serial link 112, the FPGA device 150 may be limited to the local memory blocks 107 of the FPGA device 150. Additionally, the FPGA device 150 may be limited to processes implemented by or controlled by the host processor 101. The array interconnect 111 and/or the high speed serial link 112 may be configured to connect or communicative couple the FPGA device 150 to one or more other FPGA devices.

For example, the array interconnect 111 and/or the high speed serial link 112 may include one or more ports. The ports may connect the FPGA device 150 to one or more other FPGA devices or to cards with FPGA devices to form arrays, which may be capable of executing the source code 170. In some embodiments, the source code 170 may be segmented into the kernels 105. A portion of the kernels 105 segmented from the source code 170 including a first kernel 105A and a second kernel 105B may be implemented by the FPGA device 150, while other of the kernels 105 may be implemented by other FPGA devices in the array. Processing the kernels 105 in the FPGA device 150 may be performed using the local interconnect 106, the local memory blocks 107, the global interconnect 102, the external memory banks 104, or some combination thereof. Moreover, the first and second kernels 105A and 105B may be implemented using input data communicated from another member device in the array and/or may communicate output data resulting from execution of the first and second kernels 105 to the other member devices of the array.

The array interconnect 111 can be implemented using a global memory address expansion protocol. The global memory address expansion protocol may extend the physical global memory address of the FPGA device 150 into virtual or physical addresses of the entire array. This address translation may enable a unified address memory space for the array. In some embodiments, the array interconnect 111 can be implemented per specification of one or more known standards, for example, Infiniband or a custom interconnect protocol.

The ports in the array interconnect 111 and/or the high speed serial link 112 may utilize electrical or optical serial connection. The optical serial connection may be useful for extending an array beyond a physical size of a card cage, equipment rack, data room, or beyond a single geographical location. The array interconnect 111 may have a broadcast capability to replicate the data from the host processor 101 or any individual FPGA device to some or all of the FPGA devices of the array. This capability may reduce latency of data exchange during initialization and normal operation.

In the depicted embodiment, the FPGA device 150 includes memory logic that further includes a first external memory bank 104A, a second external memory bank 104B, and a Kth external memory bank 104C. Similarly, the memory logic of the FPGA device 150 includes a first memory controller 103A, a second memory controller 103B, and a Kth memory controller 103C. Similarly still, the memory logic includes a first local memory block 107A, a second local memory block 107B, and an Mth local memory block 107C. Inclusion of the Kth and Mth component along with the ellipses is meant to indicate that the memory logic may include more than three external memory banks 104, more than three memory controllers 103, more than three local memory blocks 107, or some combination thereof. Additionally, in the depicted embodiment, the FPGA device 150 includes the array interconnect 111, the high-speed serial link 112, the global interconnect 102, the memory controllers 103, and the local interconnect 106 as separate components. In some embodiments, one or more of these components and/or functions attributed to these components may be combined into few components or may be separated into more individual components.

Figure 2:
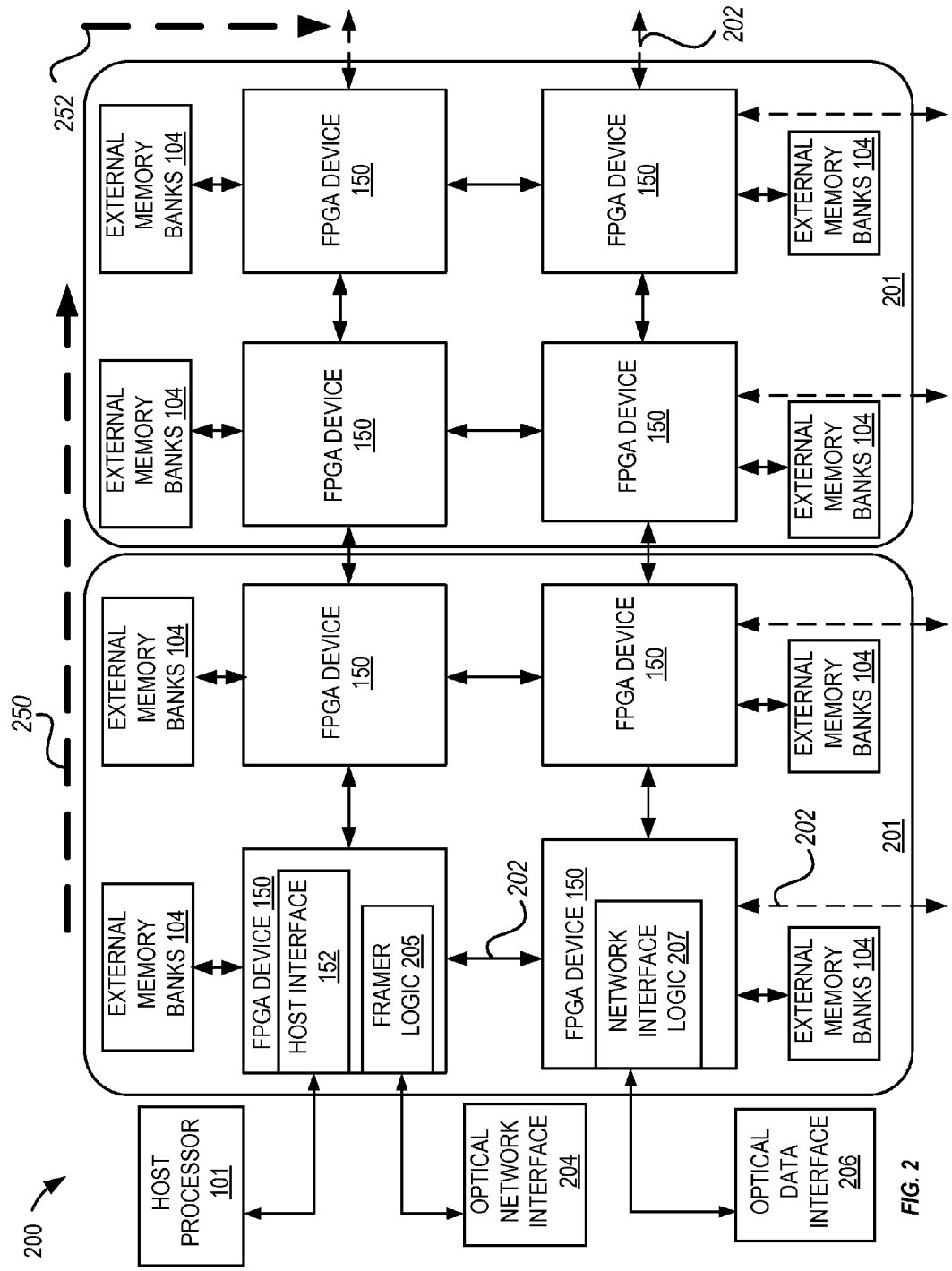
FIG. 2 illustrates an example array that includes one or more of the FPGA devices of FIG. 1.

FIG. 2 illustrates an example array 200 that may include one or more of the FPGA devices 150 of FIG. 1. The array 200 includes eight of the FPGA devices 150 discussed with reference to FIG. 1. The FPGA devices 150 are interconnected into a two-dimensional array include two rows and four columns. As used herein the convention [number row×number of columns] is used to describe two dimensional arrays. For example, the array 200 is a [2×4] array. The array 200 resides on two cards 201. Each of the cards 201 includes a [2×2] array of FPGA devices 150. The FPGA devices 150 may include ports 202. The ports 202 may be configured to expand global memory of each of the FPGA devices 150. Additionally, the ports 202 may be utilized to expand the array 200 by adding additional cards (e.g., card 201) having one or more FPGA devices.

In some embodiments, the array 200 may include more than eight or fewer than eight FPGA devices 150, which may be determined based on the data rates of computing elements of the source code, computational performance of the FPGA devices 150, the input/output (I/O) bandwidth of the FPGA devices 150. The array 200 may take other topologies and dimensions. Some details of these arrays are discussed with reference to FIGS. 7-10.

One or more of the FPGA devices 150 may include the host interface 152 to interface with the host processor 101. An example of the host interface 152 may include a peripheral component interconnect express (PCIe) endpoint logic or another suitable logic. In addition, one or more of the FPGA devices 150 may include framer logic 205. The framer logic 205 may be configured to interface with an optical transport network and/or an optical transport network interface 204 (in FIG. 2, "optical network interface 204"). An example of the framer logic 205 may include an optical transport network (OTN) framer and an associated Generic Framing Procedure (GFP) of a client signal such as user datagram protocol/ transmission control protocol (UDP/TCP) stack for 1 GE-100 GE Ethernet. Additionally still, one or more of the FPGA devices 150 may include network interface logic 207 to interface with an optical data network interface 206 and associated forwarding data plane and control plane protocol such as OpenFlow. Other telecomm, data, storage interfaces such as Fiber Channel and custom communication protocols can have connections to the array 200 and/or one or more of the FPGA devices 150 included therein.

One or more of the FPGA devices 150 may be coupled to one or more of the external memory banks 104 as described with reference to FIG. 1. The external memory banks 104 may be allocated entirely or partially to a global memory, which may be addressable by a unified address memory space of the array 200. Having global memory interconnect reduces interface of the host processor 101 to the array 200. Accordingly, in some embodiments, only one of the FPGA devices 150 is connected to the host processor 101. In other embodiments more than one of the FPGA devices 150 may be connected to the host processor 101. In embodiments having multiple FPGA devices 150 connected to the host processor 101, multiple types of connections may be implemented between the FPGA devices 150 and the host processor 101 (e.g., PCIe and the like). Similarly, embodiments of the array 200 may include one or more of the FPGA devices 150 that may be connected to the optical network 204 and/or the optical data interface 206 via multiple types of the connections.

In the array 200, one or more processes may occur sequentially. In addition the processes may occur in parallel. For example, in the example array 200 depicted in FIG. 2, a dataflow direction 250 may be a direction in which processes occur sequentially. In addition, one or more of the processes may occur in one or more parallel process directions 252. In the embodiment if FIG. 2, there is only one parallel process direction 252. However, arrays including larger directions may include multiple parallel process directions 252.

In some embodiments, the dataflow direction 250 is orthogonal to the parallel process direction 252. Such processing may have a dominant dataflow direction 250 in the array 200. Accordingly, partitioning of source code among the FPGA devices 150 may include multiple instructions among kernels, parallel execution by multiple kernels, kernel vectorization, generic loop unrolling with indexing, or some combination thereof in the dataflow direction 250 and/or the parallel process direction 252. In some embodiments, the vectorization of the source code may be performed in the dataflow direction 250. In the parallel process direction 252, generic loop unrolling with indexing may be performed during the partitioning. The indexing may correspond to individual packets or to a simple kernel replication, for example.

Some examples of the processing with dominant data direction may include deep packet inspection, data search and information filtering algorithms at line rate. The data search algorithm may be executed by the FPGA device 150 on a real-time network traffic. The data search algorithm may be replicated by broadcasting it to one or more parallel kernels in the array 200. One or more data search patterns may be preloaded into the local or global memory (e.g., 107 and 104, respectively). Thus, a data search algorithm performed by the array 200 may be conducted substantially simultaneously for one or more data patterns. Such data search algorithm may be performed in parallel or sequential fashion on the live traffic as well as on recorded data collected from the live traffic at prior time.

Figure 3:
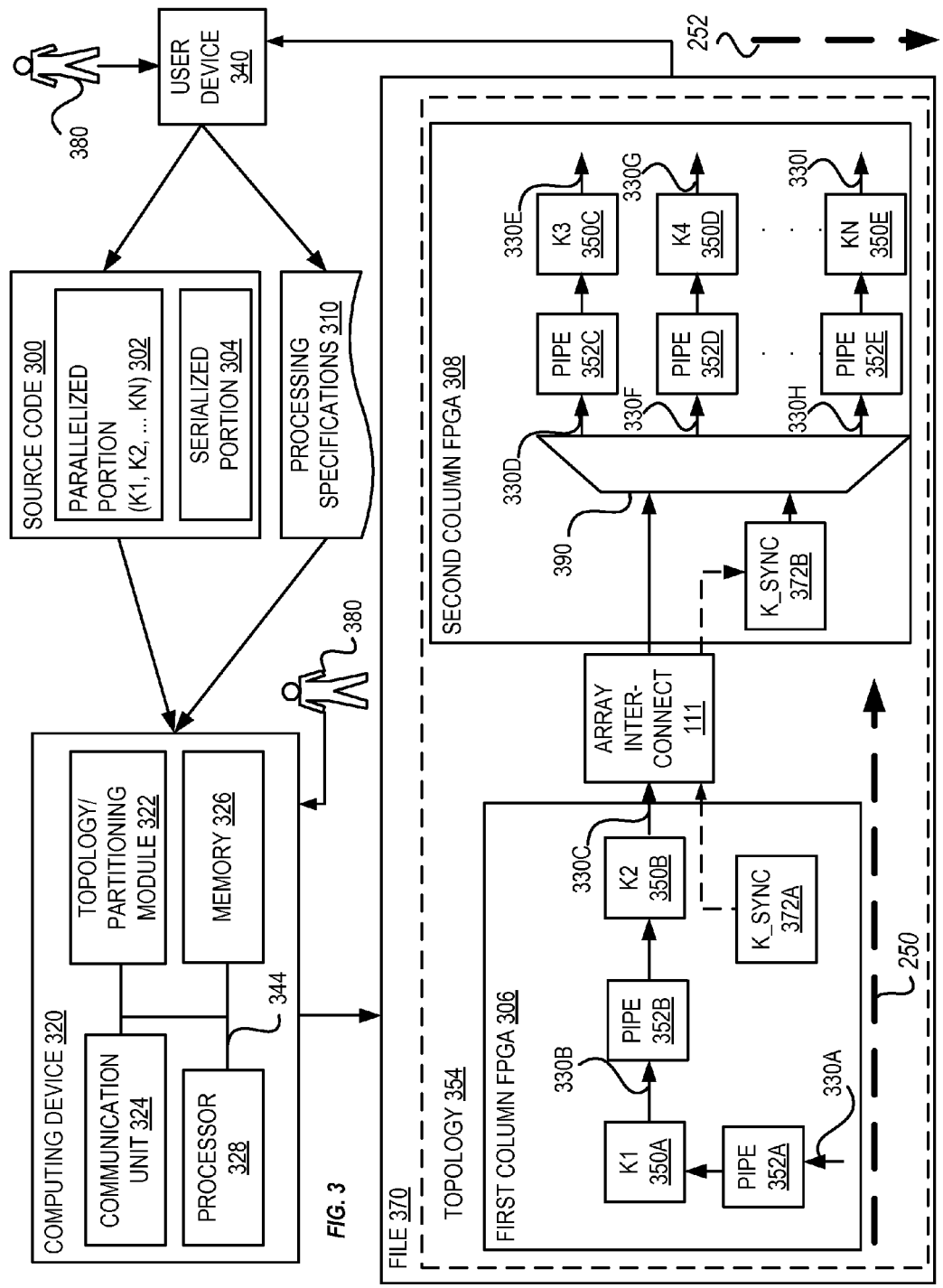
FIG. 3 is a block diagram of an example partitioning of a source code that may be implemented by a computing device.

FIG. 3 is a block diagram of an example partitioning of a source code 300 that may be implemented by a computing device 320. Partitioning the source code 300 may include a process by which parallelized portions 302 of the source code 300 are allocated to one or more FPGA devices 306 and 308 in an array topology 354 ("topology 354" in FIG. 3). For example, in the example shown in FIG. 3, the array topology 354 includes a first column FPGA device 306 and a second column FPGA device 308. The first column FPGA device 306 and the second column FPGA device 308 are collectively referred to as FPGA device 306/308. The FPGA devices 306/308 may be substantially similar to the FPGA device 150 discussed elsewhere herein. As depicted in FIG. 3, the first column FPGA device 306 may be coupled to the second column FPGA device 308 via the array interconnect 111. The coupling between the first column FPGA device 306 and the second column FPGA device 308 may enable data and memory transfers between the first column FPGA device 306 and the second column FPGA device 308 via the array interconnect 111. The first column FPGA device 306, the second column FPGA device 308, and the array interconnect 111 may be included in the array topology 354.

A topology/partitioning module 322 may receive as input the source code 300 and one or more processing specifications 310. The topology/partitioning module 322 may partition the source code 300 based on the processing specification 310. Additionally, the topology/partitioning module 322 may be configured to determine the array topology 354 that is configured to execute the source code 300 according to the partitioning and the processing specifications 310. Some examples of the processing specifications 310 may include a number of packets per second arriving at a network node, a number of packets leaving a network node, a number of parallel data storage interfaces that are concurrently active, an instantaneous bit-rate of a storage data stream, an aggregate amount of data per second at an input to the array, and a speed at which an answer is required to be derived.

Additionally, the topology/partitioning module 322 may be configured to segment or re-segment the parallelized portion 302 of the source code 300. The segmenting the parallelized portion 302 may generate a computing element such as kernels 350A-350E (generally, kernel 350 or kernels 350, in FIG. 3, K1, K2, K3, K4 and KN). The kernels 350 may then may be executed by the FPGA devices 306/308. The topology/partitioning module 322 may also be configured to determine whether to include additional code between the kernels 350. For example, as depicted in FIG. 3, pipes 352A-352E (generally, a storage element such as FIFO or a register or a pipe 352 or pipes 352) may be added to provide communication of intermediate results between the kernels 350.

For example, the topology/partitioning module 322 may partition the kernels 350 among the FPGA device 306/308 in the array topology 354. However, in some circumstances, the array topology 354 cannot meet one or more processing specification. In these circumstances, the topology/partitioning module 322 may modify the array topology 354 by adding one or more FPGA devices 306/308, adding a row of FPGA devices 306/308, adding a column of FPGA devices 306/308, or otherwise modification to the array topology 354 such that the processing specification can be met. Additionally or alternatively, the topology/partitioning module 322 may segment the parallelized portion 302 into more kernels 350, which may help meet the processing specifications 310. Additionally or alternatively, the topology/partitioning module 322 may include one or more storage elements such as first in, first outs (FIFOs) or pipes 352, which may help meet the processing specifications 310. Although only pipes 352 are depicted in FIG. 3, one or more of the pipes 352 may be substituted for or include one or more FIFOs.

The topology/partitioning module 322 may be configured to partition the source code 300 and determine the array topology 354 according to a maximum speedup factor. The maximum speedup factor may be based on optimization among data rates 330A-330H (generally, data rate 330 or data rates 330), computational capabilities of the FPGA devices 306/308, and I/O pipe bandwidth (330A and 330C but not 330B) in the FPGA devices 306/308. In FIG. 3, the data rates 330 are represented in by item numbers pointing to arrows connecting to pipes 352 and the kernels 350 that represent a dataflow direction.

The topology/partitioning module 322 may analyze the source code 300 to determine the data rates 330 as executed by the array topology 354 while taking into consideration computational performance and/or I/O pipe bandwidth of the FPGA devices 306/308. Based on the data rates 330, the computational performance of the FPGA devices 306/308, the I/O pipe bandwidth of the FPGA devices 306/308, or some combination thereof, the topology/partitioning module 322 may derive optimal utilization of the FPGA devices 306/308, whether to include the pipes 352, and whether to modify the array topology 354.

FIG. 3 depicts a partitioning of the source code 300. The source code 300 may include a computation sequence such as those found in the communication signal chains. The source code 300 may include the parallelized portion 302 and a serialized portion 304. The serialized portion 304 may be performed by a host processor such as the host processor 101 of FIG. 1. The topology/partitioning module 322 may segment the parallelized portion 302 into the kernels 350, which may be partitioned by the topology/partitioning module 322 to be executed by the FPGA devices 306/308.

The pipes 352 may be configured to control the data rate 330 between the kernels 350. In general, execution of the source code 300 and accordingly execution of one or more kernels 350 may involve exchange of input/output data samples or intermediate results from one kernel 350 to one or more subsequent kernels 350 and/or between the FPGA devices 306/308. The data rates 330 between the kernels 350 may vary. For example, a first kernel 350A may include a multiplication computation of two one-byte numbers. An intermediate result of the first kernel 350A may be a two-byte number, which may be input to a second kernel 350B. The second kernel 350B may include a same sampling frequency as the first kernel 350A, however the second kernel 350B may be receiving a number that is twice the length. Accordingly, a first pipe 352A and/or a second pipe 352B may be included to synchronize and/or buffer the data rates 330A and/or 330B of the first and second kernels 350A and 350B.

Storage element may be added between the kernels 350. For example, the storage element can be a memory location in a first in, first out (FIFO) or a digital flip-flop. In the depicted embodiment, the pipe 352 may be implemented as a FIFO, and may accordingly include multiple storage elements. In some embodiments, the storage elements may include similar components implemented between the kernels 350.

In the array topology 354, the pipes 352 are included prior to each of the kernels 350. The topology/partitioning module 322 may determine whether to include the pipes 352 based on the data rates 330, the computational performance of the FPGA devices 306/308, the I/O pipe bandwidth of the FPGA devices 306/308, or some combination thereof. Accordingly, in some embodiments, one or more kernels 350 may not be preceded by one of the pipes 350

The exchange of samples, data or intermediate results of computations between the FPGA devices 306/308 may be performed by the array interconnect 111. The array interconnect 111 may include a low latency and high-speed interconnect as well as dedicated dataflow interconnect. The array interconnect 111 may also be utilized by a global memory. In some embodiments, samples and intermediate results may have to have higher priority over global memory accesses. However, global memory access rate and expected dataflow rate are evaluated by topology/partitioning module 322 to make the decision whether to permit sharing of the interconnect 111 or to direct dataflow to the dedicated interconnect. The array interconnect 111 may be configured to have small footprint. Some additional details of an example array interconnect 111 are provided elsewhere herein.

One or more synchronization kernels (in FIG. 3, "K_sync") 372A and 372B (generally, synchronization kernel 372 or synchronization kernels 372) may be included in the array topology 354. In some embodiments, each of the first column FPGA device 306 and the second column FPGA device 308 may include one of the synchronization kernels 372A or 372B. One of the synchronization kernels 372A or 372B may include a slave synchronization kernel that may be configured to synchronize intermediate results between two or more of the kernels 350. Additionally, one of the synchronization kernels 372A or 372B may include a master synchronization kernel configured with synchronization information pertaining to the slave synchronization kernel and to further synchronize the slave synchronization kernel with the kernels 350 in the array topology 354.

For example, in the depicted embodiment, a first synchronization kernel 372A may be a master synchronization kernels and a second synchronization kernel 372B may be a slave synchronization kernels. Accordingly, the first synchronization kernel 372A may synchronize the second synchronization kernel 372B with the kernels 350.

The second synchronization kernel 372B may be configured to synchronize a multiplexer 390. For example, the second synchronization kernel 372B may synchronize the multiplexer 390 to coordinate received intermediate results from the second kernel 350B and/or the array interconnect 111 and control the data rates 330D, 330F, and 330H to a third kernel 350C through a Nth kernel 350E. The second synchronization kernel 372B may be aware of the changes to the upstream data rates (e.g., 330A-330C) and/or downstream data rates (e.g., 330D-330I) and may adjust the data rates 330D, 330F, and 330H accordingly.

The third through the Nth kernels 350C-350E may operate at one or more input data rates 330D, 330F, and 330H which may be slower than the input data rate. In some embodiments, one or more of the data rates 330D, 330F, and 330H may be substantially similar. For example, the data rates 330D, 330F, and 330H may be the data rate 330C divided by a number of kernels 350 downstream of the multiplexer 390 (e.g., in FIG. 3, 330C/n−2) and output one or more results at the data rates 330E, 330G and 330I that may be proportional to an input and an output with possible data format width increase (e.g. increase in precision).

In some embodiments, the data rates 330D, 330F, and 330H may be individualized for one or more of the kernels 350 downstream of the multiplexer 390. The third kernel 350C through the Nth kernel 350E may output a result of the parallelized portion 302 of the source code 300. Accordingly, the array topology 354 may have a predominant dataflow direction.

Throughout the array topology 354, various data rates 330 may exist. The data rates 330 may be based on the kernels 350 segmented from the parallelized portion 302. Thus, a total data rate of the source code 300 in the array topology 354 may be determined. If the total data rate is below a processing specification 310 indicating a particular processing specification 310, then the array topology 354 may be modified. For example a row of FPGA devices may be added or the FPGA devices 306/308 may be substituted for FPGA devices with higher I/O bandwidths.

Additionally, performance of the kernels 305 can be achieved by optimization of pipelining as well as utilizing local memory. Generally, having the kernels 350 operating in the FPGA devices 306/308 may reduce memory bottlenecks in proportion to an increase in available local memory of each of the FPGA devices 306/308.

In some circumstances, a maximum speedup factor of a fastest kernel may be limited by the computation capacity FPGA devices 306/308 and a maximum data rate 330 as partitioned in the array topology 354. When the maximum data rate 330 (not necessarily I/O data rate) exceeds maximum I/O pipe data rate, it is important not to expose the results of these computations to the external I/O and instead utilize the wide internal data width of FPGA fabric.

In the depicted embodiment, the first column FPGA device 306 executes the first kernel 350A and the second kernel 350B. Additionally, the second column FPGA device 308 executes the remaining kernels 350C-350N. This partitioning is an example of straight forward spatial partitioning. Depending on the source code 300, the straight forward spatial partitioning may not be optimum. Accordingly, the topology/partitioning module 322 may be configured to explore if an additional speedup factor can be achieved if one or more of the kernels 350 (e.g. the second kernel 350B) can be segmented into additional kernels 350, which may be executed by the FPGA devices 306/308.

In some embodiments, the topology/partitioning module 322 may be configured to partition the source code 300 in larger array topologies. In these and other embodiments, partitioning the source code 300 may include the estimation of the data rates to derive optimum utilization of FPGA devices in the array per each application. Provided that partitioning is done effectively and interconnect bandwidth does not impose additional limits, the speedup factor of FPGA array can increase in proportion to the computation capacity of the entire FPGA array.

In FIG. 3, the computing device 320 may be controlled by a user 380. Additionally or alternatively, the user 380 may input the source code 300 and/or the processing specifications 310 to the computing device 320 via a user device 340. The array topology 354 and/or the partitioning based thereon may be presented to the user 380. For example, the array topology 354 and/or the partitioning based thereon may be presented on a display or via a user interface. In response the user 380 may modify the processing specifications 310 on which the array topology 354 is based or accept modifications to the array topologies 354 suggested by the topology/partitioning module 322 to achieve the processing specifications 310. In these embodiments, the topology/partitioning module 322 may operate as a tool that determines array topologies 354 specific for the source code 300 and the processing specifications 310. In these and other embodiments, the user 380 may periodically be presented with updates and/or provided with opportunities to override the array topology 354 suggested by the topology/partitioning module 322.

The user device 340 and/or the computing device 320 may include any computing device that includes a processor 328, memory 326, and network communication capabilities, which may include a communication unit 324. The processor 328, the memory 326, the communication unit 324 are only depicted in the computing device 320. In some embodiments, the processor 328, the memory 326, the communication unit 324 are included in the user device 340.

Some examples of the user device 340 and/or the computing device 320 may include a laptop computer, a desktop computer, and a tablet computer. Additionally or alternatively, in some embodiments the user device 340 and/or the computing device 320 may include a hardware server or portion thereof. In the user device 340 and/or the computing device 320 the topology/partitioning module 322, the processor 328, the memory 326, and the communication unit 324 may be communicatively coupled by a bus 344.

The processor 328 may include an arithmetic logic unit (ALU), a microprocessor, a general-purpose controller, or some other processor array to perform partition of the source code 300 and/or determination of the array topology 354. The processor 328 may be coupled to the bus 344 for communication with the other components (e.g., 322, 326, and 324). The processor 328 generally processes data signals and may include various computing architectures including a complex instruction set computer (CISC) architecture, a reduced instruction set computer (RISC) architecture, or an architecture implementing a combination of instruction sets. Multiple processors may be included in the computing device 320 and/or the user device 340. Other processors, operating systems, and physical configurations may be possible.

The memory 326 may be configured to store instructions and/or data that may be executed by the processor 328. The memory 326 may be coupled to the bus 344 for communication with the other components. The instructions and/or data may include code for performing the techniques or methods described herein. The memory 326 may include a DRAM device, an SRAM device, flash memory, or some other memory device. In some embodiments, the memory 326 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The communication unit 324 may be configured to transmit and receive data. The communication unit 324 may be coupled to the bus 344. In some embodiments, the communication unit 324 includes a port for direct physical connection to a communication network (e.g., the Intranet, a WAN, a LAN, etc.) or to another communication channel. For example, the communication unit 324 may include a USB, SD, CAT-5, or similar port for wired communication. In some embodiments, the communication unit 324 includes a wireless transceiver for exchanging data via communication channels using one or more wireless communication methods, including IEEE 802.11, IEEE 802.16, BLUETOOTH®, or another suitable wireless communication method. In some embodiments, the communication unit 324 includes a wired port and a wireless transceiver.

In some embodiments, to determine the array topology 354 an iterative process may be performed by the topology/partitioning module 322. For example, the topology/partitioning module 322 may determine a proposed topology (e.g., topology 354). The proposed topology may be based on a processing specification, the source code 300, an estimated dataflow rate, or some combination thereof.

The estimated dataflow rate may be based on a processing specification that may be input from a user. Additionally or alternatively, the estimated dataflow rate may be estimated by an input and output rate for a set of source code applications. The estimation of the dataflow rate (or maximum internal data rate) may continue through an entire chain of computations executed by FPGA devices.

For example, some source code applications such as computed tomography (CT) for medical imaging may include a specified data rate per second, which may not be deviated from. For instance, an examination of a patient in a doctor's office may involve processing of a real-time image pixels and a display of an image at twenty nine frames per second. This source code application may not back off from this dataflow rate for any reason. Accordingly, the proposed topology may be based on this dataflow rate.

Other source code applications may not include a strict dataflow rate. In these source code applications, a goal may be to complete the task or tasks as fast as possible, but there may not be a restriction as to how long the task may take. For example, such a source code application may include post processing of acquired or recorded CT images off-line with more detailed criteria than those processed during patient examination at the office. A goal may be to complete the thorough comparison and evaluation of the CT images to a reference disease database, but there is no restriction for how long the post processing and evaluation might take. For these applications a peak data rate may be optimized during the partitioning iterations to maximize usage of FPGA device computational resources, while having limits on the maximum input/output data rates determined by the specific FPGA devices, but not the user specification as in the case with real-time applications.

The topology/partitioning module 322 may then partition the source code 300 among the FPGA devices 306/308. The topology/partitioning module 322 may determine whether each of the FPGA devices 306/308 is capable of achieving the processing specification 310.

If not, the topology/partitioning module 322 may determine whether a neighboring FPGA device 306 or 308 has sufficient processing capability to accommodate a difference between the processing specification and a deficiency of the FPGA devices 306 or 308. If so, the topology/partitioning module 322 may perform load balancing the kernels 350 assigned to the FPGA devices 306/308 and determine whether the proposed topology achieves the processing specification following the load balancing.

In response to a determination that the FPGA devices 306/308 are capable of achieving the processing specification 310 and in response to a determination that the proposed topology achieves the processing specification 310, the topology/partitioning module 322 may present the proposed topology to the user 380. In response to a determination that the neighboring FPGA devices 306 or 308 have insufficient processing capability and/or in response to a determination that the proposed topology does not achieve the processing specification 310, the topology/partitioning module 322 may modify the proposed topology.

In some embodiments, after the array topology 354 is presented to the user 380, the topology/partitioning module 322 may receive user input sufficient to modify the processing specification 310. In response, the topology/partitioning module 322 may modify the array topology 354 based thereon and re-partition the source code 300 among FPGA devices 306/308 as arranged according to the modified array topology 354.

In some embodiments, to determine the array topology 354 the topology/partitioning module 322 may determine whether to include additional code such as the pipes 352, the synchronous kernels 372, and multiplexers 380 between the FPGA devices 306/308 and/or the kernels 350. If so, the topology/partitioning module 322 may generate additional code including the pipes 352, the synchronous kernels 372, and multiplexers 380.

As mentioned in reference to FIG. 2, the array topology 354 may include FPGA devices 306/308 arranged in the dataflow direction 250 in which data is processed and in the parallel process direction 252, which may be orthogonal to the dataflow direction 250. In these embodiments, to partition the source code 300, the topology/partitioning module 322 may read the source code 300 line-by-line and/or a processing specification. The topology/partitioning module 322 may define device logic applicable to the FPGA devices 306/308. The device logic may include one or more of a (PCIe) endpoint, an optical transport network (OTN) framer, a traffic manager, a user datagram protocol (UDP) stack, a transmission control protocol (TCP) stack, a packet forwarding protocol, and a frame forwarding protocol.

The topology/partitioning module 322 may partition the source code 300 in accordance with the array topology 354 as analyzed in the parallel process direction 252. The partitioning source code 300 as analyzed in the parallel process direction 252 may include parsing the source code 300 to identify iteration loops. Iteration loops may include "while" and "for" statements, for instance. The topology/partitioning module 322 may unroll the identified iteration loops. In response to there not being any iteration loops, a maximum number of parallel kernels (e.g., the third kernel 350C through the Nth kernel 350E) may be chosen based on a number of FPGA devices 306/308 in the parallel process direction 252 and a size of an address space of a memory expansion protocol implemented in the proposed topology 354. The partitioning parallel source code in accordance as analyzed in the parallel process direction 252 may further include replicating kernel hardware. For example, if computing units of the third through the Nth kernels 350C-350E have similar structures with different taps and coefficients at the same sampling rate, then the hardware reuse may be exploited via zero samples fill and coefficient overload techniques. Otherwise one or more of the third kernel 350C to the Nth kernel 350E may operate independently.

The topology/partitioning module 322 may vectorize one or more of the kernels 350. By vectorizing the one or more kernels 350 an optimal FPGA arrangement of the array topology 354 in the dataflow direction 252 based on a utilization of the resources of the FPGA devices 306/308. The vectorizing may include iterating a number of work items and iterating a number of compute units. In some embodiments, iterating the number of work items may include iterating a number "N" in a work item attribute: _attribute_((num_simd_work_itmes (N))), in which N represents a number that includes a value 1, 2, 4, 8, or 16. In some embodiments, iterating the number of compute units may include iterating a number M in a compute unit attribute: _attribute_((num_compute_units(M))), in which M represents an integer.

The topology/partitioning module 322 may determine whether resources of one or more of the FPGA devices 306/308 of the proposed topology 354 are utilized. The topology/partitioning module 322 may take into consideration already defined device logic in making such determination. If not, the topology/partitioning module 322 may reiterate (e.g., iterate again) the number of work items and/or the number of compute units. If so, the topology/partitioning module 322 may determine whether one or more of the kernels 350 are too large to be executed by one or more of the FPGA devices 306/308.

In response to the one or more of the FPGA devices 306/308 having a capability to process the kernel 350, the number of work items and/or the number of compute units for the kernels 350 may be included in the file 370. In response to the kernel 350 being too large, the topology/partitioning module 322 may split the kernel 350 into two or more segmented kernels 350.

The topology/partitioning module 322 may determine whether to include one or more storage elements to communicate data between the kernels 350. In response to a determination to include the storage element, the topology/partitioning module 322 may add the storage element to the proposed topology 354. In response to a determination not to include the storage element or a pipe, the topology/partitioning module 322 may reiterate the number of work items and/or the number of compute units.

The topology/partitioning module 322 may save or present the file 370. The file 370 may include an optimized kernel and a proposed topology file. The file 370 may include device array address indexing information utilized for modifications of a host processor code.

The partitioning of the source code 300 is described with respect to embodiment in which the source code 300 is formatted according to an OpenCL. In some embodiments, the source code 300 may be formatted in C or C++ and translated to OpenCL by the topology/partitioning module 322 or a third party translator. Additionally or alternatively, the C or C++ source code may be segmented and passed down to the FPGA devices 306/308 for HLS C/C++ or OpenCL FPGA flow. Additionally, one or more embodiments may be configured for execution and use of another parallel software language such as CUDA.

As mentioned above, to enable computing elements or kernels of the array 200 to be programmed with uniform address space of a global memory, the array interconnect 111 may be implemented. The array interconnect 111 may be configured with low latency of load and store accesses among the member devices 150 and to support multiple priorities for atomic accesses, burst accesses, streaming access and single or ordinary accesses (collectively, accesses). For example, some load and store accesses such as atomic access cannot be sub-divided and interleaved with other type of accesses (e.g., burst accesses, streaming access, and single). Others types of access may have low tolerance to latency or delay such as burst accesses or data streaming. Accordingly, the array interconnect 111 may be configured to appropriately control the accesses low latency and multiple priorities. Additionally, the array interconnect 111 may maintain load and store order and data synchronization and may not allow access or data loss. The array interconnect 111 may be configured with adaptive address resolution and routing and graceful congestion handling.

Figure 4:
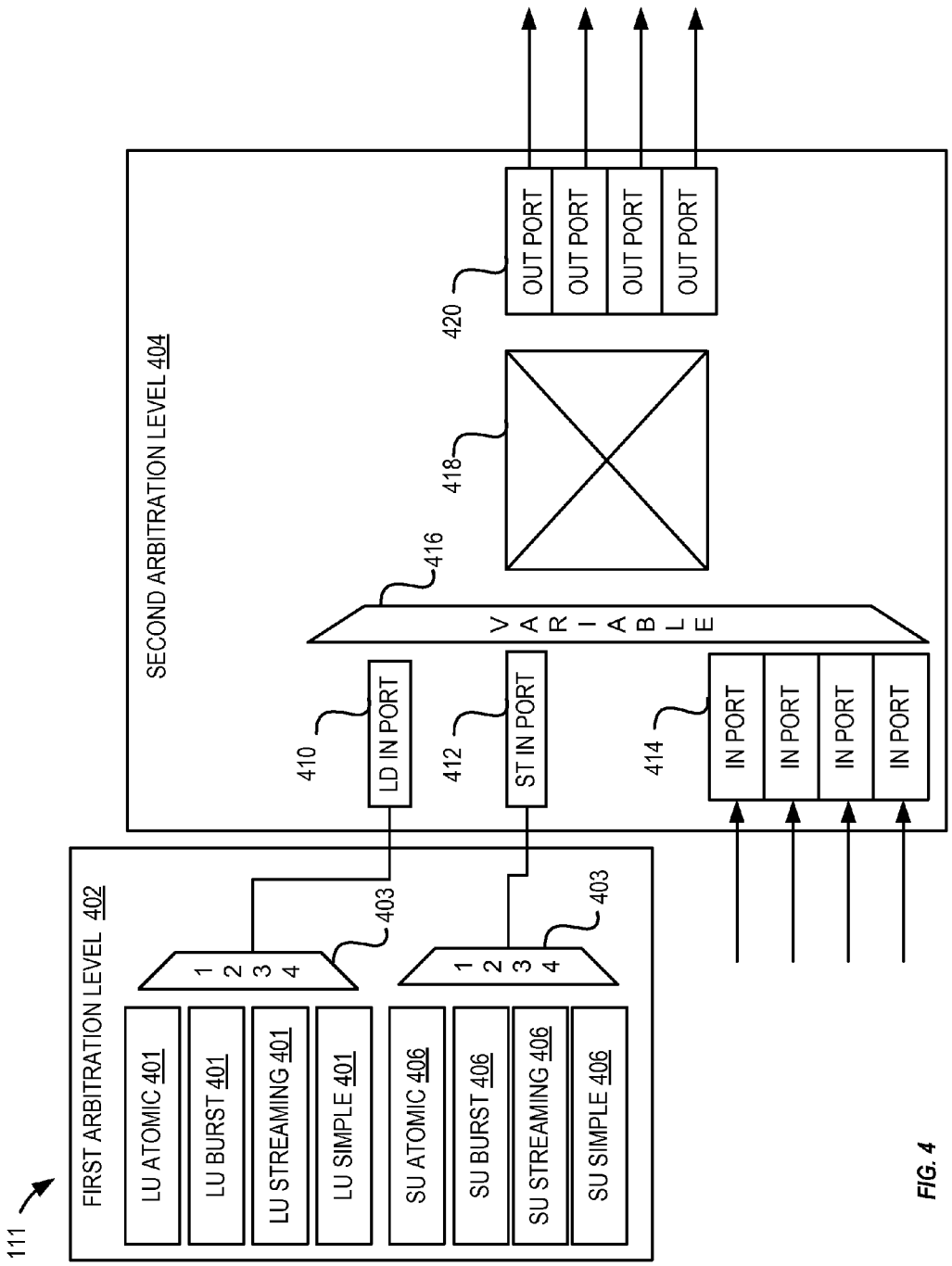
FIG. 4 illustrates an example array interconnect that may be implemented in the array of FIG. 2.

In general, a kernel may include requests to write (store) and/or read (load) data to and from local or global memory. Write requests and read requests may be handled by load and store units (LSU). The LSU may include load units 401 and store units 406. Each of the load units 401 and the store units 406 may include one or more access types. For example, in FIG. 4, the load units 401 and the store units 406 include atomic, burst, simple or single, and streaming.

Some implementations of LSUs, which may include implementations chosen by a device vendor, may rely on a commercial computer bus architecture. Some examples of the commercial computer bus architecture may include advanced microcontroller bus architecture (AMBA), AXI, or a proprietary Avalon architecture by Altera Corporation. The array interconnect 111 may interface with one or more of the commercial computer bus architectures. Additionally or alternatively, the commercial computer bus architectures may be isolated with a bus bridge, for instance.

The low latency may be controlled through selection of a granularity of the access. The granularity may be based directly on an amount of source data that an initiating LSU requires to send or receive across the array interconnect 111 to replicate the access by a remote LSU at a destination. The amount of source data is defined herein as a cell. By treating minimum load and store data as independent cells the array interconnect 111 may be scalable and efficient in terms of utilization of the FPGA resources.

The array interconnect 111 may support the following cell types: a store cell, a store burst, a store streaming cells, a load single initiator cell, a load single return data cell, a load burst, a load streaming cell initiator cell, a load return data cell, data cells, and an interconnect system cell. System cells may be utilized to exchange status and control information among the array interconnects as well as for access synchronization. The cells may bear payload. A non-payload bearing or idle cell may be transmitted during serial link idle times or between payload bearing cells. The non-payload bearing cells may be used to delineate cell boundaries, to maintain serial link integrity and to establish and to maintain alignment of the serial links. One or more cells may have port pair backpressure information such that local port congestion information may be distributed in the timeliest fashion globally among the member devices.

The cell size of load and store transactions may be different. A single load and store access may have a minimum cell size. The maximum cell size may be chosen to be the size of the largest single transaction. The maximum cell size may enable treatment of the burst access as just the burst of cells or streaming data as a stream of cells. The number of cells in the burst may be equal to a number of individual transactions of the burst. Additionally, the cell size may vary based on a particular implementation of the LSU and an associated bus architecture. The cell size may be selected for each implementation and the cell granularity may be maintained for each store and load access. Thus the cell size may be adjustable per each LSU implementation. Allowing adjustment of the size may reduce complexities and extra hardware and buffering in store and forward architectures and segmentation and reassembly functions that may lead to high latency.

The array interconnect 111 may be configured to prioritize atomicity of the accesses that cannot be interleaved with other accesses. Additionally, the array interconnect 111 may be configured to facilitate low latency for the accesses that have low latency tolerance. For example, the array interconnect 111 may include a fixed priority arbitration. The fixed priority arbitration may assign four priorities to LSU units 401 and 406 of based on type. Additionally, the array interconnect 111 may include a first arbitration level 402 and a second arbitration level 404.

In the first arbitration level 402, the load units 401 and the store units 406 of different access types may receive a priority assignment. The priority assignment may be based on the properties of the access type. For example, the priority assignment may be based on atomicity, divisibility, and tolerance to latency and delay. In the depicted embodiment, the LSUs including an atomic access (e.g., the LU atomic 401 and the SU atomic 406 in FIG. 4) receive a highest priority of 1, the LSUs including a burst access (e.g., the LU burst 401 and the SU burst 406 in FIG. 4) receive a priority of 2, the LSUs including a streaming access (e.g., the LU streaming 401 and the SU streaming 406 in FIG. 4) receive a priority of 3, and the LSUs including a simple access (e.g., the LU streaming 401 and the SU streaming 406 in FIG. 4) receive a lowest priority of 4.

The array interconnect 111 may include one or more arbiters 403. The arbiters 403 may be configured to arbitrate the load units 401 and the store units 406 based at least partially on the priority assignments. The accesses may be arbitrated by the arbiters 403 in parallel. By arbitrating the accesses in parallel, access initiators may not be starved and access time dependencies may not be introduced. Additionally, arbitrating the accesses in parallel may allow initiating load unit 401 to include a burst access (LU burst 401) and a store unit to include a burst access (SU burst 406) on every clock cycle.

After the LSUs are arbitrated, the access data associated with the LSUs becomes a cell. The priority information may be carried in the cell. Each of the cells are substantially equivalent to any other of the cell of the array interconnect 111. The cells may then enter the second arbitration level 404.

The second arbitration level 404 may include a local load in port 410 (in FIG. 4, "LD in Port 410"), a local store in port 412 (in FIG. 4, "ST in Port 412"), and a global in port 414. The local load in port 410 and the local store in port 412 may receive the cells from the arbiters 403. The global in port 414 may receive cells from other member devices in an array implementing the array interconnect 111.

Additionally, the second arbitration level 404 may include a second level arbiter 416, a switch 418, and an output port 420. In the array each FPGA may have shared resources, which may include the switch 418 and the output port 420. The output port 420 may pass cells to one or more other member devices of the array or another array interconnect that may be substantially similar to the array interconnect 111. In some embodiments, one second level arbiter 416 may be included for each output port 420. The number of input and output ports and arbiters may be dependent on a number of array dimensions. For example, a two-dimensional array may include an interconnect having four ports and a three-dimensional array may include an interconnect having six ports.

In a forward direction, one or more of the cells may arrive to one of the input ports 410, 412, or 414. To pass traffic through to the member device of an array and/or the array interconnect, the shared resources are arbitrated by the second level arbiters 416 that have variable priority assignments per each arriving cell. The cells carry priority information in its header upon which the arbitration of the second level arbiters 416 is based. Moreover, the cells may be similarly arbitrated at the one or more other array interconnects in the array. Thus, a priority of the data path through the array interconnect 111 and any other array interconnect in the array may be maintained. Additionally, the array interconnect 111 may enable scalability of the arrays. In some embodiments, buffering resources by the input port 414 and the switch 418 may be distributed equally among member devices of the array, which may enable each array interconnect 111 to use a smallest possible size of the FPGA resources determined by the number of LSU units 401 and 406, the input ports 414, and the output ports 420.

The array interconnect 111 may be expanded to arrays of larger topologies. For example, the array interconnect 111 may be expanded to support arrays of three dimensions and larger dimensions. Moreover, the interconnect topologies supported by the array interconnect 111 are not limited to the symmetrical arrays. The arrays can be clustered into a larger interconnect networks where each cluster can have larger dimensions array or dense mesh interconnect to facilitate local computations with fewer inter-cluster interconnect links. The inter-cluster interconnect links can encapsulate cells into higher level protocols such and OTN or Ethernet.

Figure 5:
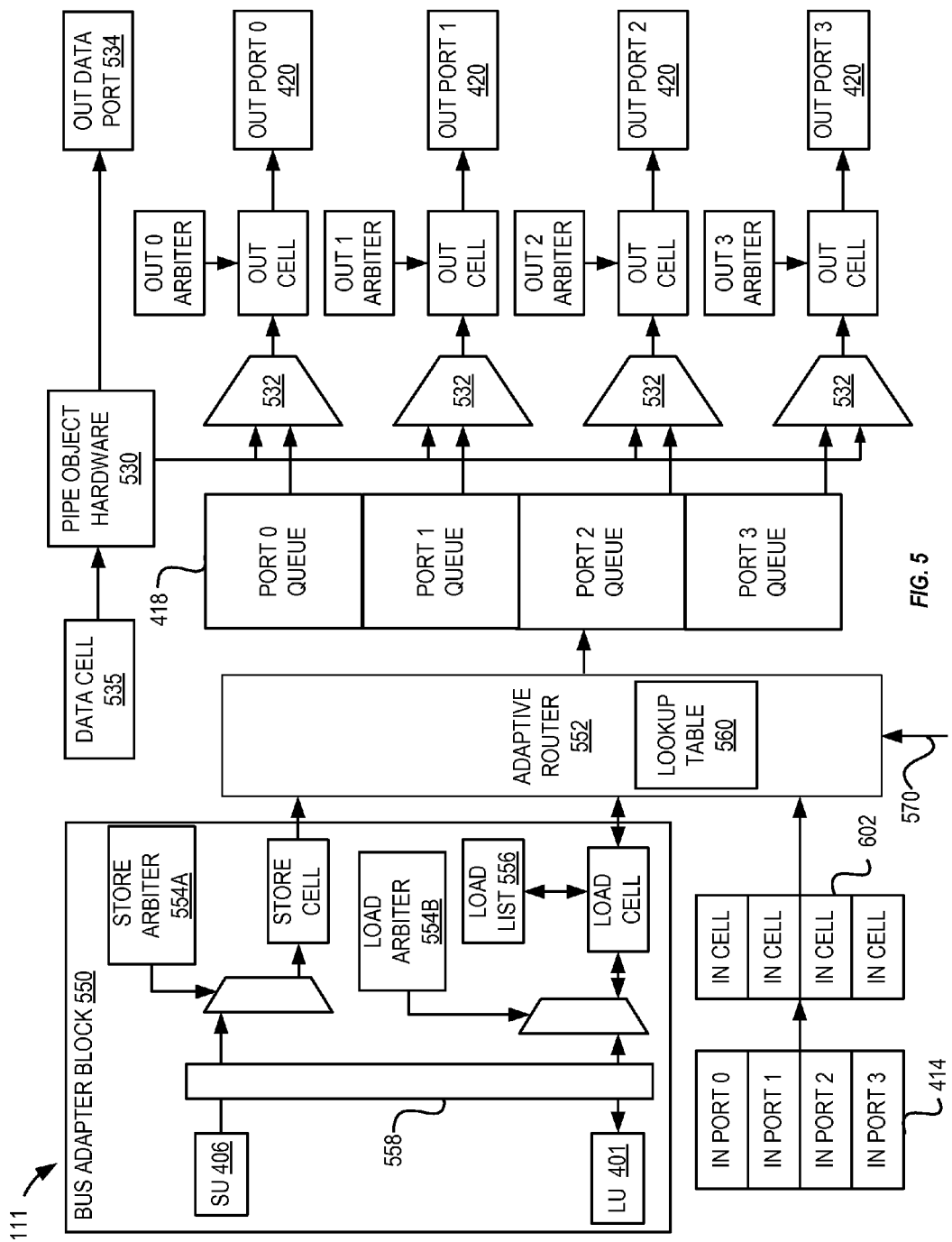
FIG. 5 illustrates a detailed depiction of the array interconnect of FIG. 4.

FIG. 5 includes a detailed view of the array interconnect 111. The array interconnect 111 in FIG. 5 is depicted in a forward data path. Additionally, the array interconnect 111 of FIG. 5 is representative of an implementation in a [4×4] array. FIG. 5 depicts an example of how decisions about destination of the cells may be performed to provide a uniform global memory address space.

The array interconnect 111 may include a bus adapter block 550. The bus adapter block 550 may represent logic involved in isolation of specifics of a LSU bus protocol from the rest of the array interconnect 111. The bus adaptor block 550 may include the store units 450, the load units 410, a load arbiter 554B, a store arbiter 554A, an address monitor and decode logic 558, and a load list 556.

The address monitor and decode logic 558 may be configured to determine whether the LSU access falls within the address range of the local FPGA global memory or a global memory of another member device of an array implementing the array interconnect 111. In some embodiments, only the sizes of the cells are affected by a particular LSU address and data bus sizing.

In circumstances in which the address range is within a global memory of another member device, the load and store accesses may be captured into optional store cell and load cell storage stages. After arbitration by the load arbiter 554B or the store arbiter 554A, the load and store accesses may be directed to the store and load input switch ports (e.g., the load in port 410 of FIG. 1 or the store in port 412). The load arbiter 554B and the store arbiter 554A may operate in parallel.

The store access may be a one-way transaction without a return data. The load access may be a bidirectional access split into a forward cell and a return cell. The forward load cells may be arbitrated similar to the store cell. However, to track the active and pending load accesses, the load list 556 may be maintained. One or more array interconnects 111 in one or more FPGA devices of the array may include a load list 556 to track active and pending load accesses. The load list 556 may be cleared upon arrival of the return of a load access cells.

The global memory address may be mapped into a path though the array interconnects 111. For example, an adaptive router 552 may map the path through the array interconnect 111. Additionally, the adaptive router 552 may direct an incoming cell (in FIG. 5, "In Cell") to one of the output ports 420.

The mapping may be accomplished via a lookup table 560. In the lookup table 560, numbers associated with the output ports 420 may be stored per range of the global address space. The lookup table 560 may be an efficient and a fast way to implement routing function with a minimum of FPGA hardware resources.

The adaptive router 552 may reduce local and global congested paths. For example, in a two-dimensional array with four adjacent nodes, there are 2 short and 2 long output paths, which may be chosen for each incoming cell. If one of the short paths is congested another short path may be chosen by the adaptive router 552. If both short paths are congested, then adaptive router 552 may decide between one of the long paths or postpone transmission by some number of interconnect cycles.

The interconnect cycle may be determined by the fastest rate of a serial link and the maximum parallel data path bus. For example the link 12.5 Gigabits per second (Gbps)/64-bits parallel bus may include an interconnect cycle that is 195.3125 megahertz (MHz). The interconnect cycle may be one of the input/output port hardware constraints of the topology/partitioning module 322 of FIG. 3.

The decision between one of the long paths and postponing the transmission may be based on the past history of the output port. For example, if the history for a particular number of past interconnect cycles indicate that there are no gaps or only a small number of gaps less than a configurable maximum congestion factor threshold (THR MAX), then the long path may be chosen. Additionally, a warning congestion counter may be incremented. However, if the past access history indicates that the congestion factor is less than minimum congestion factor threshold (THR MIN), then a decision may be to postpone transmission by one interconnect cycle. The shortest path choice may be made on a next interconnect cycle. The warning congestion counters as well as two congestion thresholds may be maintained per each of the output ports 420.

Histories of the output ports 420 incorporate global congestion history into the decision making at the array interconnect 111. In an array, the exchange patterns and global congestion patterns may stabilize over time, which may result in simpler computations. The THR MIN and THR MAX and the congestion counters may be provided for real-time control of the congestion patterns for more complex accelerated computations. The warning counters and congestions thresholds may be adapted to each accelerated application and unique cell exchange pattern therein. Therefore, the flexible and adaptive routing scheme enables maximum utilization of array interconnect 111 with minimum impact to computational performance of the entire array.

The adaptive router 552 will also determine if arriving cells are destined for the local FPGA device and it will direct these cells to the local LSU bus masters for replication of the accesses. Some additional details of this circumstance are provided with reference to FIG. 6.

The switch 418 may include n×2 buffers. The buffers may be configured to sustain accesses from all n input ports at every clock cycle. The buffers are not assigned per port. Instead, the buffers may be shared among n input ports and two store and load input ports.

In this architecture, there may be n+2 input ports and n output ports. Accordingly, congestions may be possible. A backpressure mechanism (not shown) may be included to throttle back load and store accesses. The backpressure mechanism may originate at each output port 420 and may propagate in the direction opposite to a direction of the cells. Together with backpressure and sequence numbers, input port storage and switch buffering (discussed elsewhere herein) may not allow data loss and may provide congestion handling. For example, because the input port accesses may have already incurred delay, the choice to throttle back store and load accesses may be driven by the goal of maintaining order and sequencing of the load and store accesses. Additionally, each cell may carry sequence numbers in data bits that are shared with burst count. The sequence numbers may be checked by local master, which replicates access. Additionally, missing cells may be fragged as errors.

The array interconnect 111 may include pipe objects hardware 530. The pipe objects hardware 530 may be configured to generate data cells 535. The data cells 535 may exchange information among the member devices and/or array interconnects included therein. The data cells 535 may be an input to the pipe objects hardware 530 that include a unidirectional transfer of the data cell 535 from a source FPGA device to a destination FPGA device. The data cells 535 may be communicated to the output ports 420 through the one or more multiplexers 532 or a data output port 534, which may be dedicated to the data cells 535. Whether the data cells 535 are communicated via the output ports 420 or the data output port 534 may be based on a data rate. For relatively low data rates, the output ports 420 may be used and for relatively high data rate the data output port 534 may be used.

Figure 6:
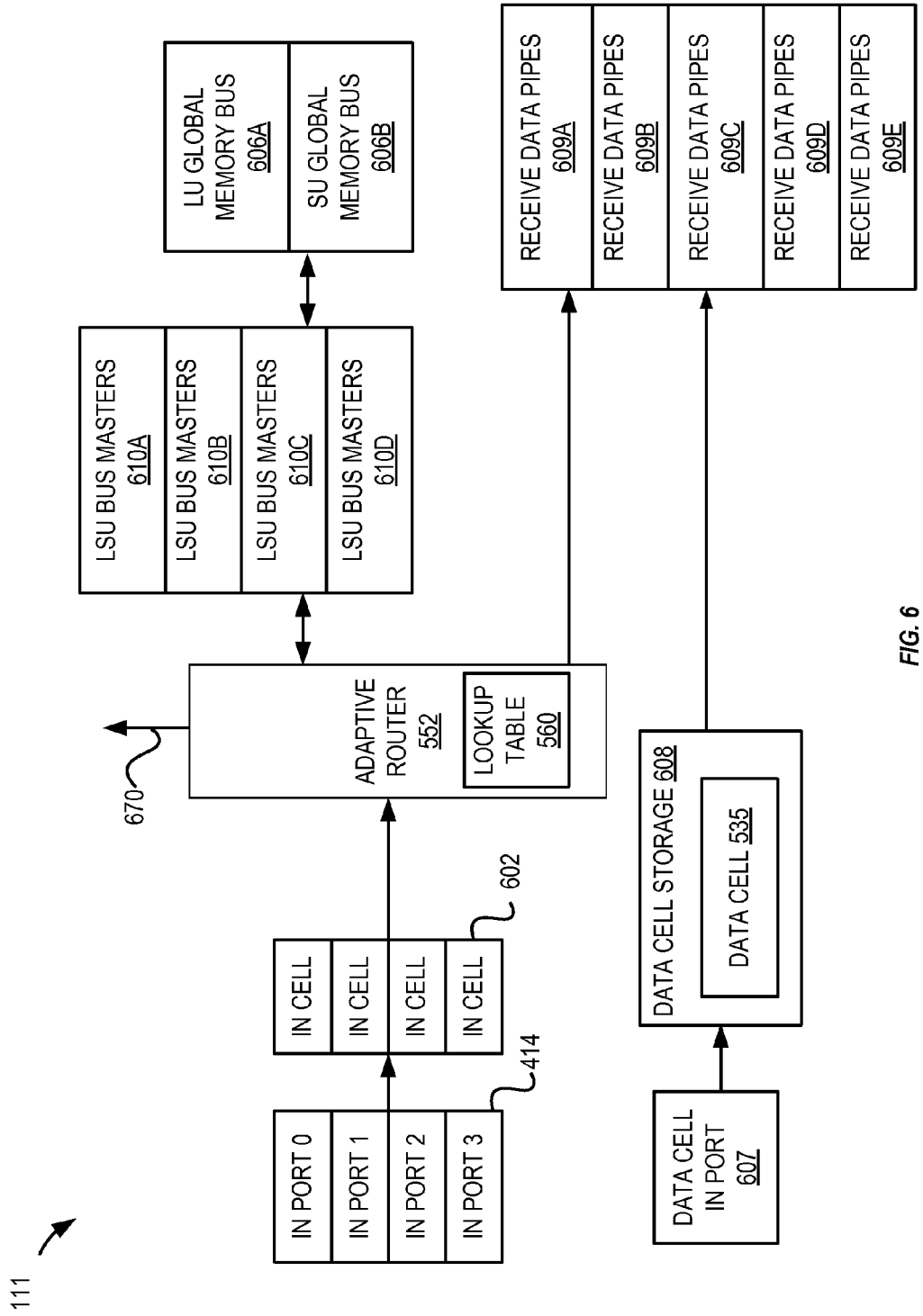
FIG. 6 illustrates another detailed depiction of the array interconnect of FIG. 4.

FIG. 6 includes another detailed view of the array interconnect 111. The array interconnect 111 in FIG. 6 is depicted in a return direction. One or more arriving cells 602 from the input ports 414 may be destined for an FPGA device implementing the array interconnect 111, referred to as the local FPGA device. Accordingly, the adaptor router 552 may receive and route the arriving cells 602 to one or more load and store unit bus masters 610A-610D (generally, LSU bus master 610 or LSU bus masters 610). The LSU bus masters 610 may be configured to finalize accesses on a load unit global bus and a store unit global bus 606A and 606B respectively.

A number of LSU bus masters 610 may be equivalent to a number of the in ports 414. The LSU bus masters 610 may be configured to operate in parallel such that the in cells 602 are not waiting for an available LSU bus master 610. Additionally, a number of LSU global memory buses 606 may be equivalent to the number of the in ports 414.

With combined reference to FIGS. 5 and 6, if one or more of the arriving cells 602 is a load cell with return data from remote load access, the arriving cell 602 is directed to the bus adapter bock 550 via arrow 670. These arriving cells 602 may clear an active entry in the load list 556. The LSU bus master 610 may also return load data to an initiating remote load unit. In this circumstance, the load data cell may be routed to the switch 418 and to one of the output ports 420 via the adaptive router 552 as shown by arrow 570 of FIG. 5. In case of the store access cells, the LSU bus masters 610 may perform a write access on one or more of the global memory buses 606. Additionally, in some embodiments, a first LSU global memory bus 606A may be for load units and a second global memory bus 606B may be for store units.

Referring back to FIG. 6, the data cells 535 may arrive from the in ports 414 (e.g., as an arriving cell 602) as well as from a dedicated input data port 607 (generally, input data port 607 or input data ports 607). The adaptive router 552 may direct the data cells 535 to a hardware implementing one or more receive data pipes 609A-609E (generally, receive data pipes 609). Additionally, the data cell in port 607 and/or a local storage 608 may direct the data cells 535 to one or more receive data pipes 609. A number of receive data pipes 609 may be equivalent to a number of receive data pipes is equivalent to the number of the in ports 414 and a number of dedicated data cell in ports 607.

Address bits of the data cell 535 may be used for a routing decision. A 64-bit address allows for $2^{64}=1.84e19$ connections in an array implementing the array interconnect 111. Accordingly, in data port 607 may include the local storage 608 for full rate serial to parallel conversion.

FIGS. 7-10 illustrate example arrays 700, 800, 900, and 1000. Each of the arrays 700, 800, 900, and 1000 may include one or more of the features and components described with reference to FIGS. 1-6. For example, each of the arrays 700, 800, 900, and 1000 may be configured to execute parallel source code partitioned among the FPGA devices included therein. Additionally, each of the arrays 700, 800, 900, and 1000 may include the array interconnect 111. Each of the arrays 700, 800, 900, and 1000 are briefly described below.

Figure 7:
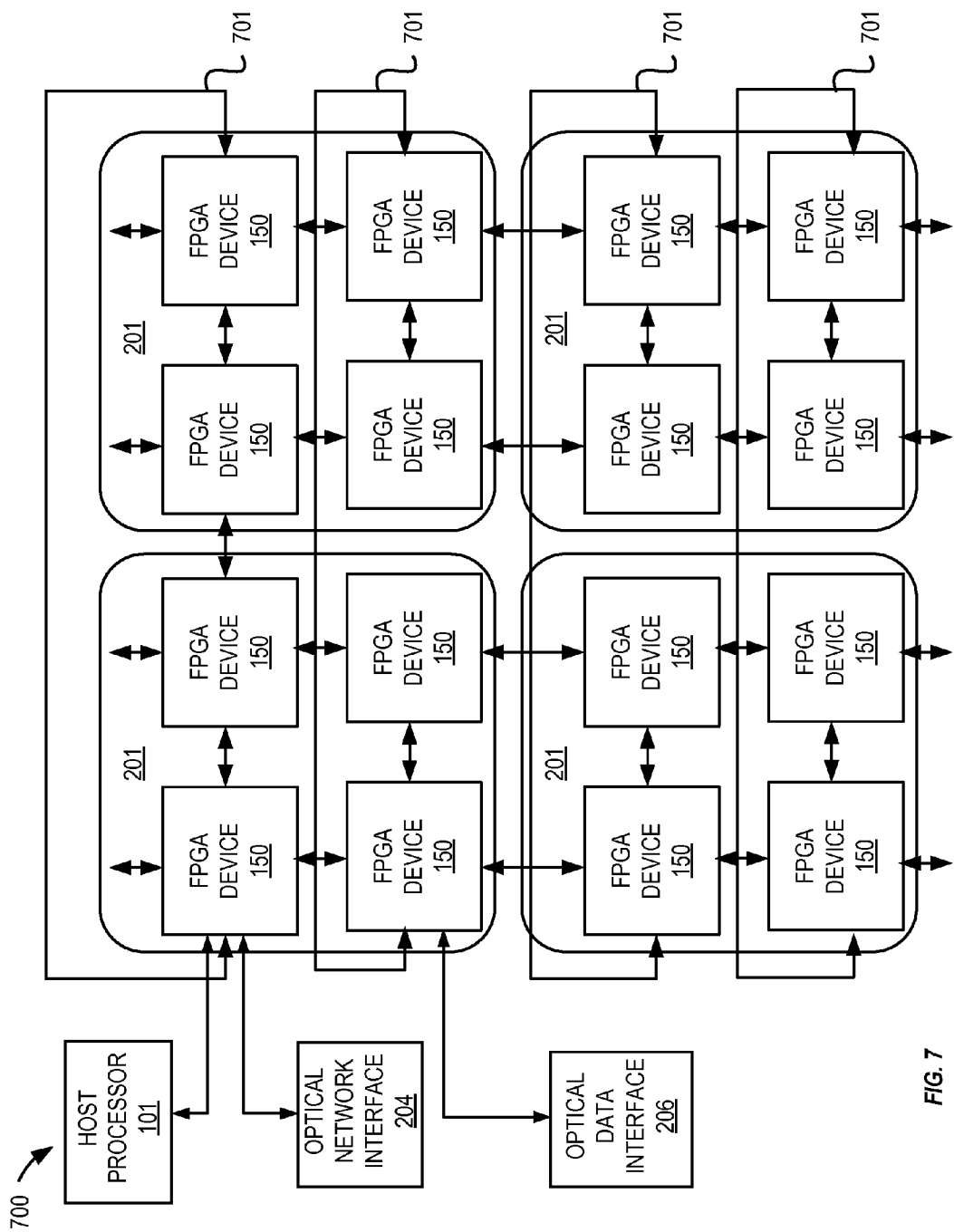
FIG. 7 illustrates a block diagram of an example array that includes one or more of the FPGA devices of FIG. 1.
Figure 8:
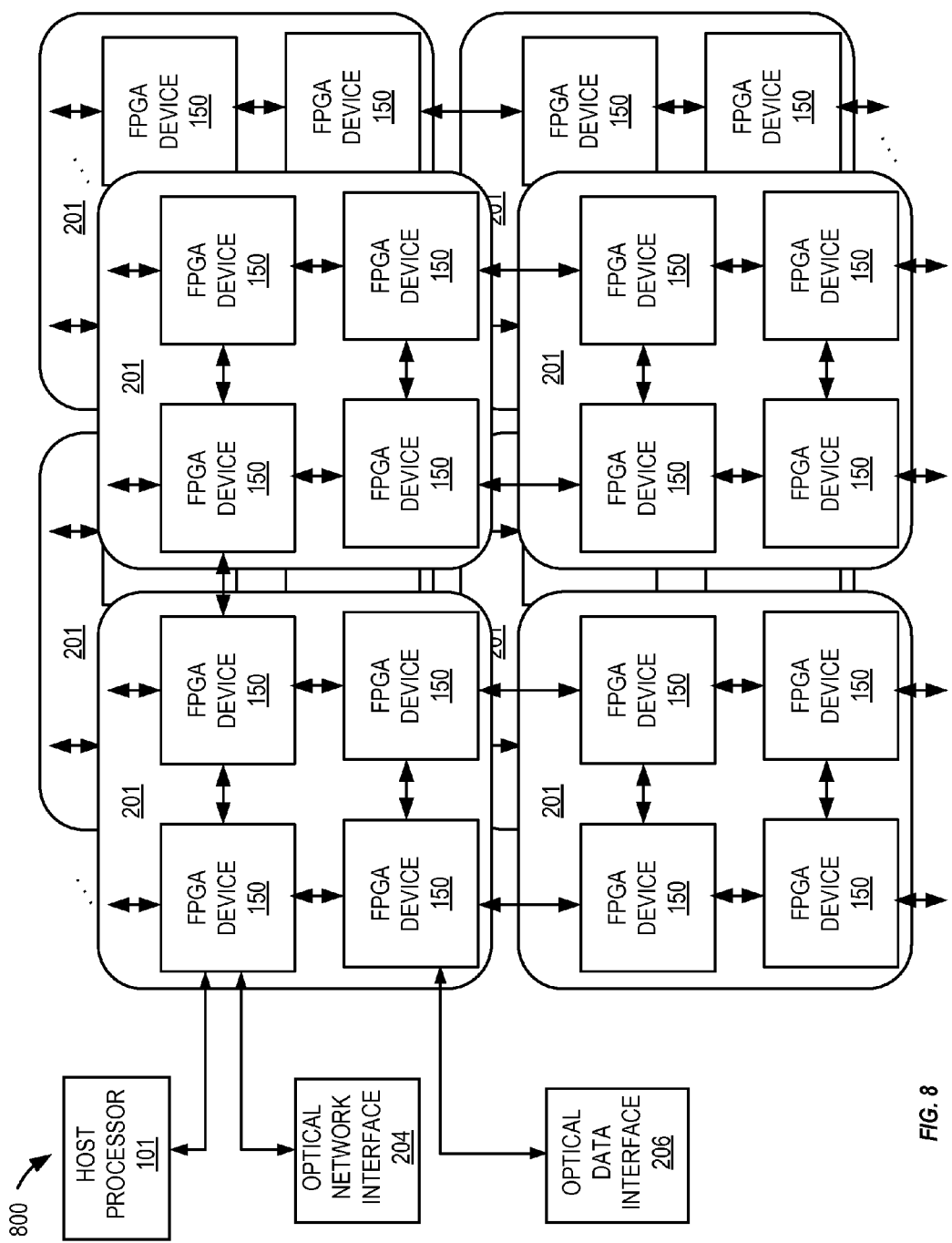
FIG. 8 illustrates a block diagram of an example array that includes one or more of the FPGA devices of FIG. 1.

FIG. 7 illustrates a block diagram of an example array 700. The array 700 a two dimensional torus array. The torus array may include a torus interconnect 701. The array 700 in some embodiments may include four global memory ports for each FPGA device 150. FIG. 8 illustrates a block diagram of another example array 800. The array 800 is a three-dimensional array. In FIG. 8, the ellipses indicate that multiple FPGA devices 150 and cards may be added. Some embodiments of the array 800 may include six ports for each of the FPGA devices 150. The array may be modified to a torus type through the addition of a torus interconnect as shown in FIG. 7. An array with higher dimensions may be built by adding ports.

Figure 9:
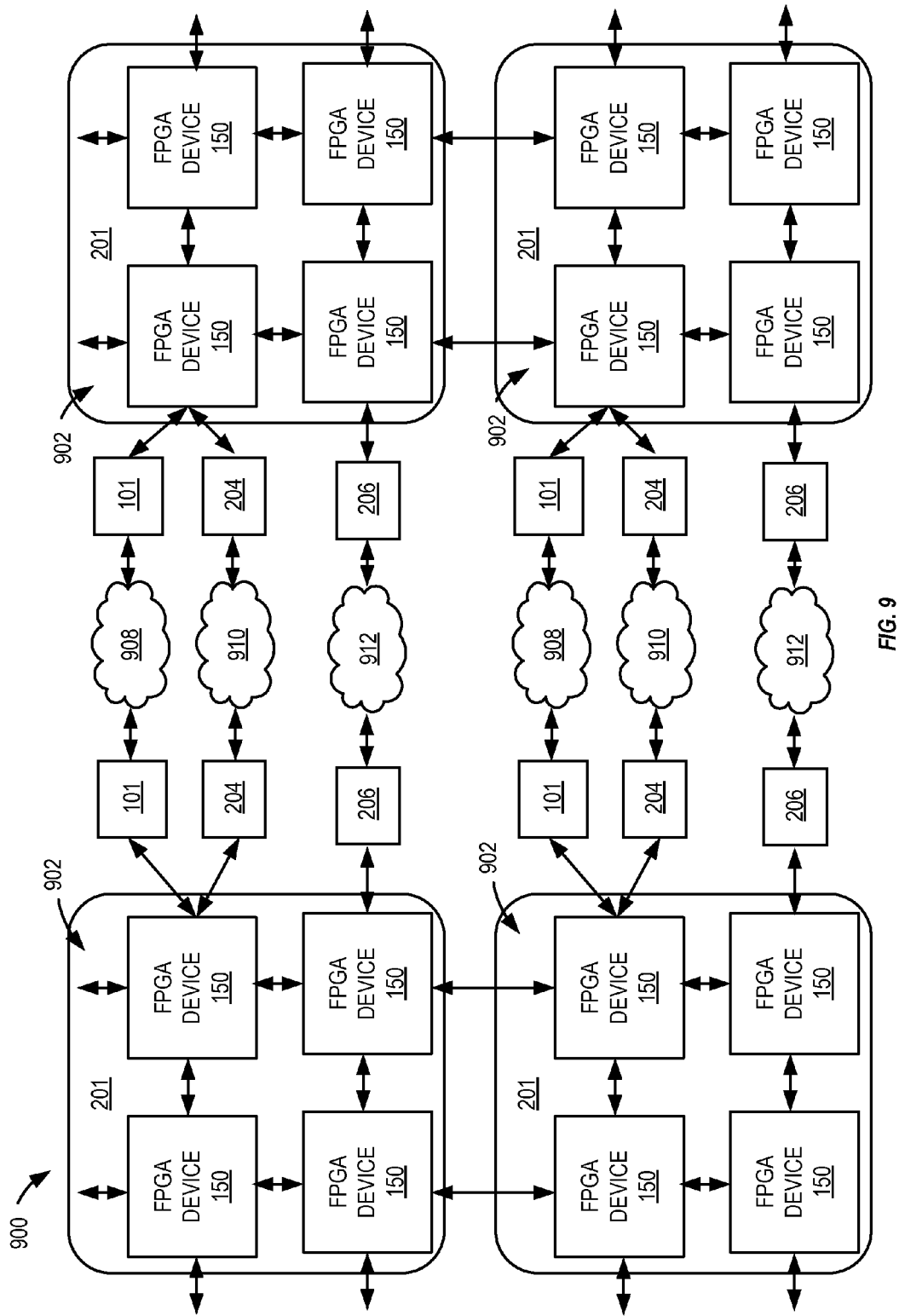
FIG. 9 illustrates a block diagram of another example array that includes one or more of the FPGA devices of FIG. 1.

FIG. 9 illustrates a block diagram of another example array 900. The array 900 includes a multiprocessing configuration with multiple host processors 101 configured as a cluster. In this configuration, multiple arrays 902 may execute accelerated computations according each host processor 101. The code may be executed asynchronously in each host processor 101 in the cluster and per each array 902. The array 900 may further include a host-to-host network 908. Some examples of the host-to-host network may include 1 GE-10 GE Ethernet. The array 900 may also include a connection to a transport network 910. For example, the connection may include an OTN at OTU2, OTU3 or OTU4 rates. The array 900 may also include a connection to a data network 912. The data network 912 may include Ethernet at 1 GE, 10 GE or 100 GE rates. A number of additional FPGA data and transport network ports may be determined by a particular parallel task.

Figure 10:
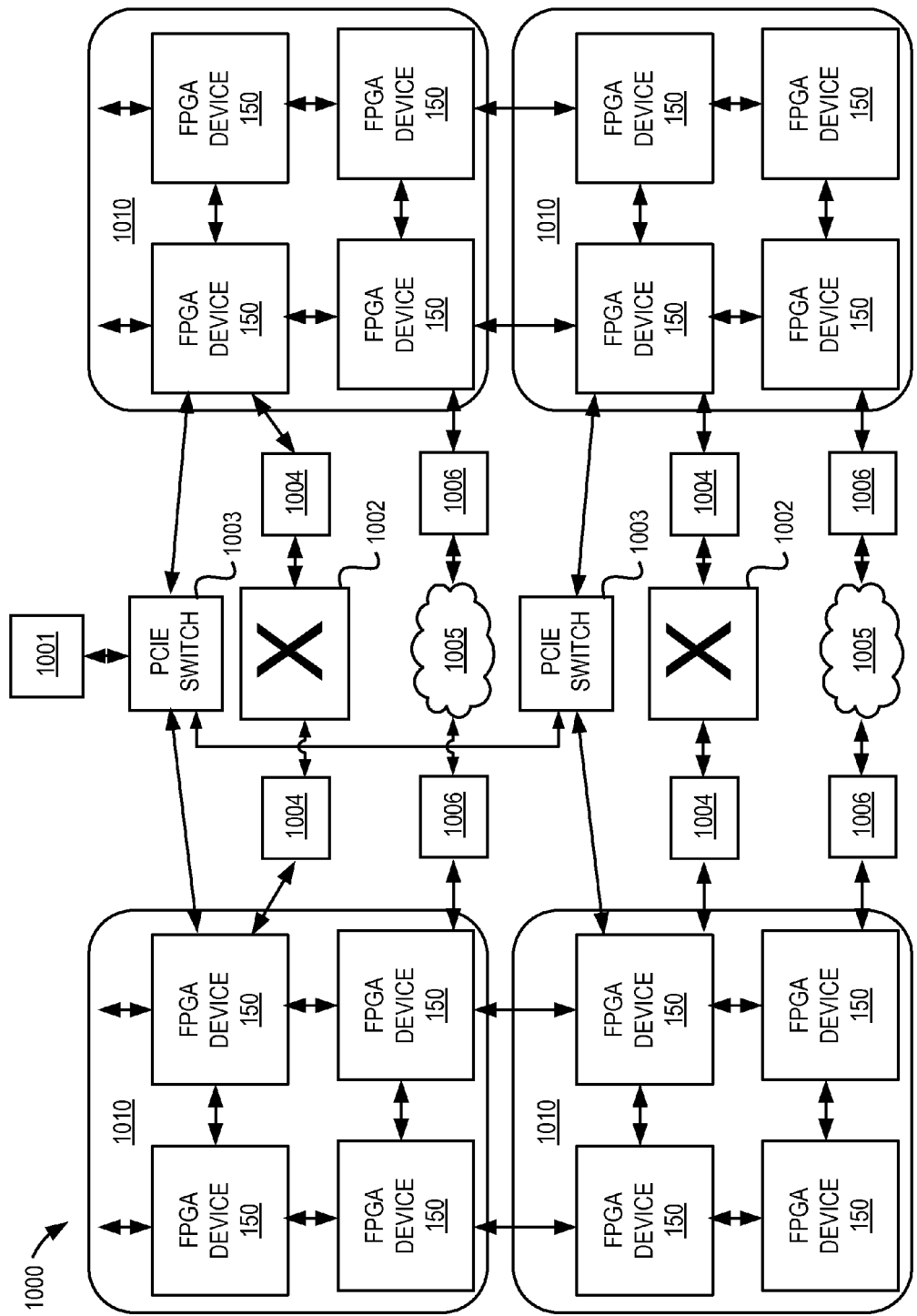
FIG. 10 illustrates a block diagram of another example array that includes one or more of the FPGA devices of FIG. 1.

FIG. 10 illustrates a block diagram of another example array 1000. The array 1000 is arranged as a switched network interconnect. The array 1000 may include a single host processor 1001 and multiple host interfaces 1003 that may include a switch feature. For example, in the depicted embodiment the host interfaces 1003 include a PCIe switch, which may be configured to selectively interface with the host processor 1001. In other embodiments, other types of host processor 1001 and interfaces 1002 may be implemented.

The array 1000 may also include multiple switches 1002. The switched 1002 may interconnect a transport or any other type of switched network 1005. The interconnected arrays 1010 may include one or more line cards each having one or more arrays of FPGA devices 150. The FPGA devices 150 may be arranged according to a functionality of forwarding plane.

In addition to an array interconnect (e.g., the array interconnect 111 described herein), some of the FPGA devices 150 may include a switch interface 1004, a framer 1006, or a traffic manager logic. The switch interface 1004, the framer 1006, or the traffic manager logic may be configured to extract the payload from a frame such as an OTN wrapper. The switch interface 1004, the framer 1006, or the traffic manager logic may reside outside of the FPGA devices 150 or inside FPGA devices 150. Thus, switching, framing and traffic management functions may be centralized or distributed.

In the example arrays 700, 800, 900, and 1000, the global memory access cells and data cells are transparently exchanged by entire array of the FPGA devices by encapsulating them in corresponding transport, data, and switched network protocols while maintaining a uniform global memory address space as well as facilitating the global data cell exchange via utilization of address bit fields as described above.

Figure 11A:
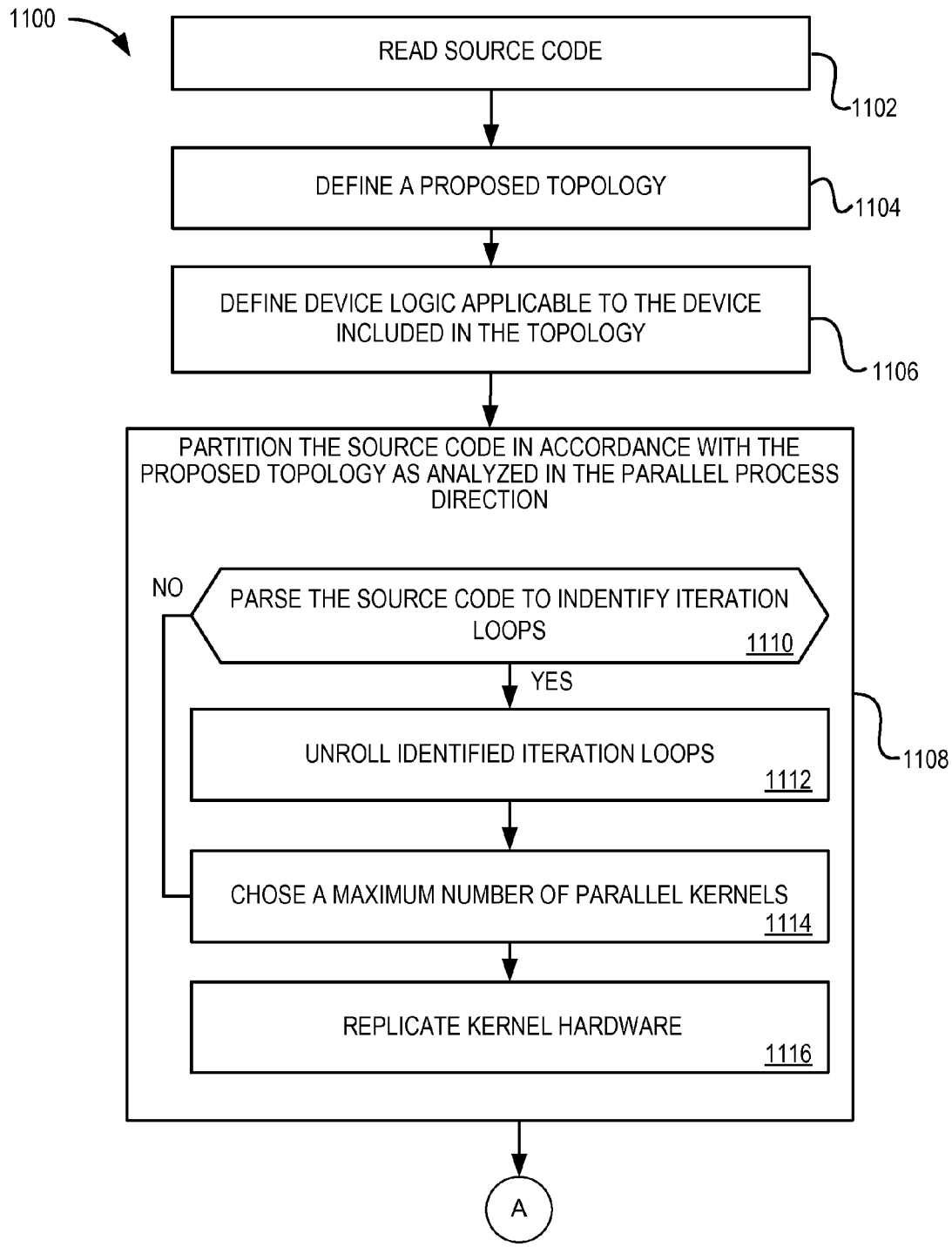
FIGS. 11A and 11B are a flow chart of an example method of the parallel code partitioning among the member devices of an array.
Figure 11B:
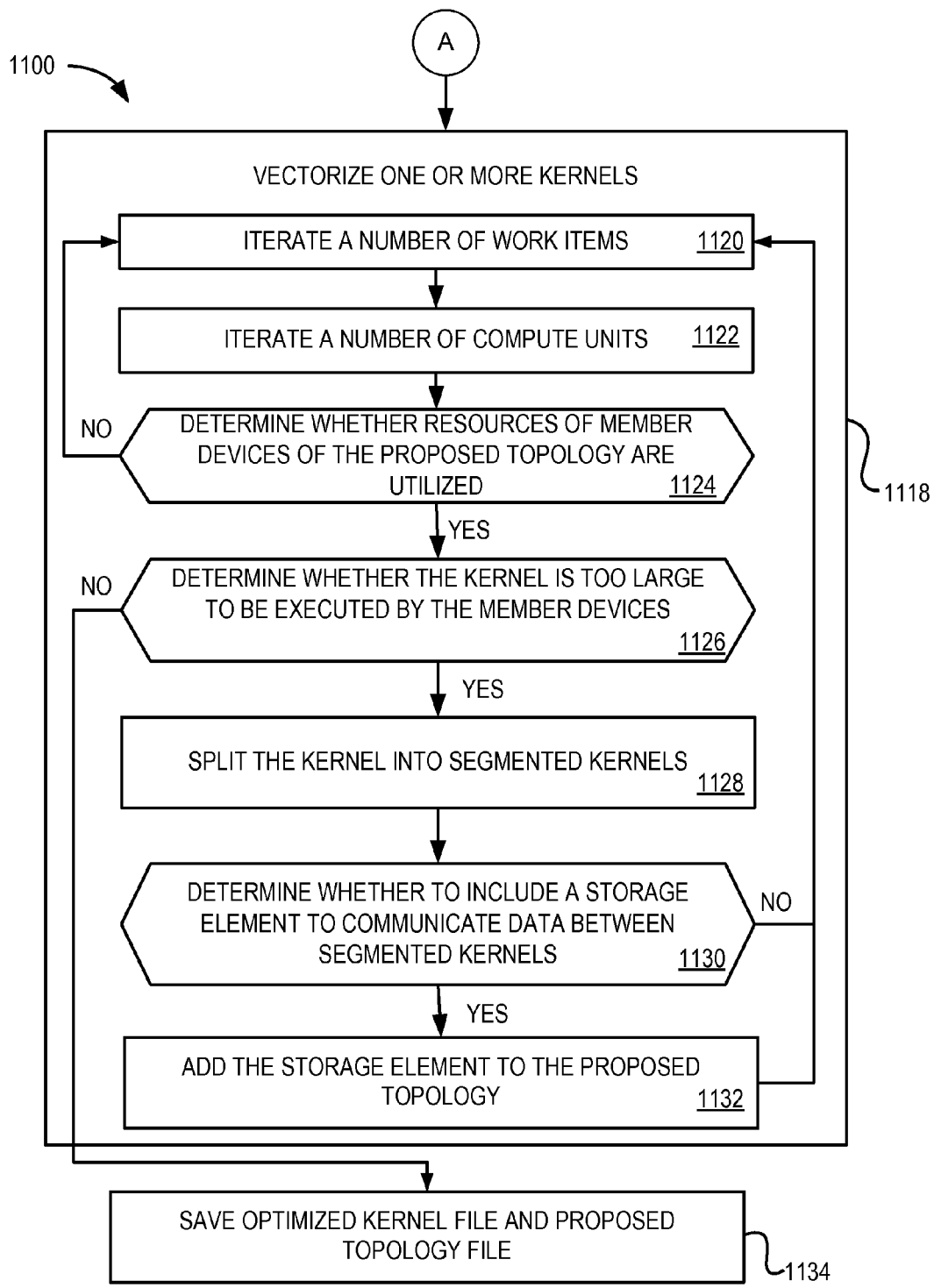

FIGS. 11A and 11B are a flow chart of an example method 1100 of the parallel code partitioning among the member devices of an array. The method 1100 may be programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform the method 1100. Additionally or alternatively, the computing device 320 may include the processor 328 described above that is configured to execute computer instructions to cause the topology/partitioning module 322 or another computing device to perform the method 1100. Although illustrated as discrete blocks, various blocks may be divided into additional blocks, combined into fewer blocks, or eliminated, depending on the desired implementation.

With reference to FIG. 11A, the method 1100 may begin at block 1102. At block 1102, a source code may be read. For example, the source code may be read line-by-line. Additionally, a processing specification may be read. At block 1104, based on the read source code and/or the processing specification, a proposed topology may be defined. The proposed topology may include devices arranged in a dataflow direction in which data is processed in the array and one or more parallel process directions that may be orthogonal to the dataflow direction.

At block 1106, based on the proposed topology a device logic applicable to the device may be defined that is applicable to the device included in the proposed topology. For example, in some embodiments, the device logic may include a PCIe endpoint, OTN framer, traffic manager, UDP stack, TCP stack, packet forwarding protocol, and frame forwarding protocol. One or more example of the device logic may occupy resources of one or more of the devices included in the proposed topology. The device logic that occupies resources of one or more of the devices may be taken into consideration during one or more other steps of the method 1100.

With reference to FIG. 11B, at block 1108, the source code may be partitioned in accordance with the proposed topology analyzed in a parallel process direction. The parallel process direction may be orthogonal to a dataflow direction. Additionally, in some arrays there may be multiple parallel process directions. For example, three-dimensional arrays may include two parallel process directions.

In some embodiments, partitioning the source code in the first direction may include one or more of blocks 1110, 1112, 1114, and 1116. At block 1110, the source code may be parsed to identify iteration loops. In response to one or more iteration loops being present in the source code ("YES" at block 1110), the method 1100 may proceed to block 1112. At block 1112, the identified iteration loops may be unrolled. In some embodiments, the loops may be partially or fully unrolled based on user input sufficient to indicate a degree to which the loops are to be unrolled.

In response to there not being any iteration loops ("No" at block 1110), the method 1100 may proceed to block 1114. At block 1114, a maximum number of parallel kernels may be chosen. In some embodiments, the maximum number of parallel kernels may be based on a number of devices in the first direction of the proposed topology. Additionally, in these and other embodiments, the maximum number of parallel kernels may be increased by adding devices in the first direction to the proposed topology. The maximum number of parallel kernels may be limited by a size of address space of a memory expansion protocol implemented in the proposed topology.

At block 1116, kernel hardware may be replicated. In some embodiments, user input may be received that is sufficient to select to replicate kernel hardware. A selection to replicate kernel hardware may be based on a specific task specification or processing specification. For example, a task in the source code may involve multiple data network ports to be processed by an identical parallel code. Accordingly, replicated kernel hardware may be implemented to process the task.

At block 1118, one or more of the kernels may be vectorized. The kernels may be vectorized to optimize a device arrangement of the proposed topology in the dataflow direction. The device arrangement may be optimized based on a utilization of array member device resources of the proposed topology. In some embodiments, the vectorization of the kernels may include one or more of blocks 1120, 1122, 1124, 1126, 1128, 1130, and 1132.

At block 1120, a number of work items may be iterated. For instance, in embodiments implemented in the OpenCL, a number of the work items may be increased by iterating a number N in an example work item attribute:
_attribute_((num_simd_work_itmes(N))).
In the work item attribute, N may be equal to integer values 1, 2, 4, 8, and 16. If N increases from 1 to 4, the amount of work executed by the FPGA device quadruples. In some circumstances, increasing the work items may be an economic way in terms of device resources to execute addition portions of the source code in parallel.

At block 1122, a number of compute units may be iterated. For instance, in embodiments implemented in the OpenCL, a number of compute units may be increased by iterating a number M in an example compute unit attribute:
_attribute_((num_compute_units(M)))
The number M may take an integer value. Increasing the number of compute units increases a number of load and store units and consequently increases required device resources in comparison to a similar increase of work items which may result in an increase in a number of busses multiplexed by the load and store units.

At 1124, it may be determined whether resources of member devices of the proposed topology are utilized. For example, in embodiments in which the member devices are FPGA devices, it may be determined whether the FPGA logic fabric and dedicated resources such as registers, blocks of local memory, and DSP blocks are utilized. In some embodiments, the defined device logic may be taken into account in a determination made at block 1124. In response to the device resources not being fully utilized ("No" at block 1124), the method 1100 may proceed to block 1120. The method 1100 may then proceed to one or more of blocks 1120, 1122, 1124, 1126, 1128, 1130, 1132, and 1134.

In response to the device resources being fully utilized ("YES" at block 1124), the method 1100 may proceed to block 1126. At block 1126, it may be determined whether the kernel is too large to be executed by a member device. In response to member device being a sufficient size to process the kernel ("NO" at block 1126), the method 1100 may proceed to block 1134. At block 1134, an optimized kernel file and a proposed topology file may be saved. The proposed topology file may contain the device array address indexing information that may be utilized, for example, for modifications of a host processor code.

In response to the kernel being too large ("YES" at block 1126), the method 1100 may proceed to block 1128. For example, if the kernel being analyzed is long and involves complex computations that cannot be performed by a single member device, the kernel may be too large. At block 1128, the kernel may be split into segmented kernels. At block 1130, it may be determined whether to add a storage element to communicate data between the segmented kernels. In some embodiments, the storage element may include an OpenCL pipe and/or a FIFO. In response to a determination to add a storage element, the method 1100 may proceed to block 1132. At block 1132, the storage element may be added to the proposed topology. The method 1100 may proceed from block 1132 to block 1120. The method 1100 may then proceed to one or more of blocks 1120, 1122, 1124, 1126, 1128, 1130, 1132, and 1134. In response to a determination not to add the storage element, the method 1100 may proceed to block 1120. The method 1100 may then proceed to one or more of blocks 1120, 1122, 1124, 1126, 1128, 1130, 1132, and 1134.

In some embodiments, using the method 1100, each kernel and/or each segmented kernel may be optimized for maximum device utilization and consequently for a largest acceleration or speedup factor. A throughput factor and an acceleration factor of each kernel and/or each segmented kernel working together with the rest of kernels may be optimized for a same speed of real-time execution. Thus, the method 1100 may result in an optimum acceleration or speedup factor for a particular array topology and the number of devices in the array.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments. For instance, when high level source code is not written in OpenCL, the method 1100 may include compiling another source code (e.g., C/C++ original code) into OpenCL code or kernels by an additional topology/partitioning module including third party topology/partitioning module. The OpenCL kernels may represent computationally intensive portions of the original source code. The remaining original source code may be executed on a host processor, for instance.

Additionally or alternatively, the method 1100 may include extracting computationally intensive portions of an original C/C++ code and create a hardware circuit by applying HLS design flow. A resulting hardware circuit may be replicated or instantiated multiple times along with an additional logic of load and store units. A number of replications may be equivalent to the number of compute units discussed above in the method 1100. An amount of multiplexing of load and store data buses may be equivalent to the number of work items in the method 1100.

Some portions of the method 1100 are described with reference embodiments in which the member devices of the arrays include FPGA devices. In some embodiments, the method 1100 may be applicable to any heterogeneous systems that may include GPUs, GPPs, DSPs, FPGA devices or any computation devices and their combinations including hybrid computing systems.

In some embodiments, if the source code includes computations without a dominant data direction as an alternative to the method 1100, the array may be treated as a computational resource pool. Accordingly, an array of FPGA devices may include as many of the kernels as possible. The array may operate essentially as one large FPGA device. In these embodiments, bandwidth of the array interconnect may be a limiting factor.

Figure 12A:
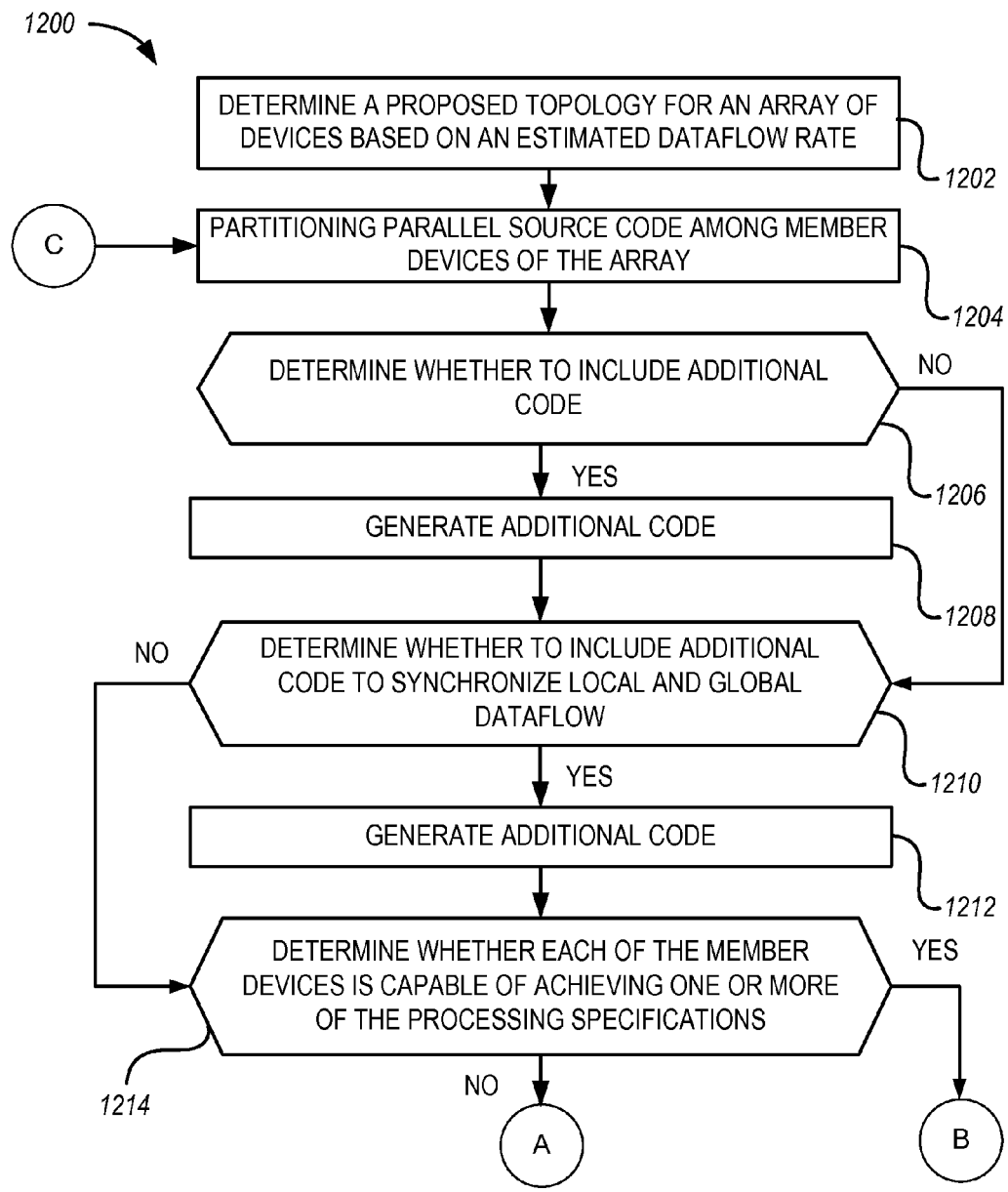
FIGS. 12A and 12B are a flow chart of an example method of array topology determination, all arranged in accordance with at least one embodiment described herein.
Figure 12B:
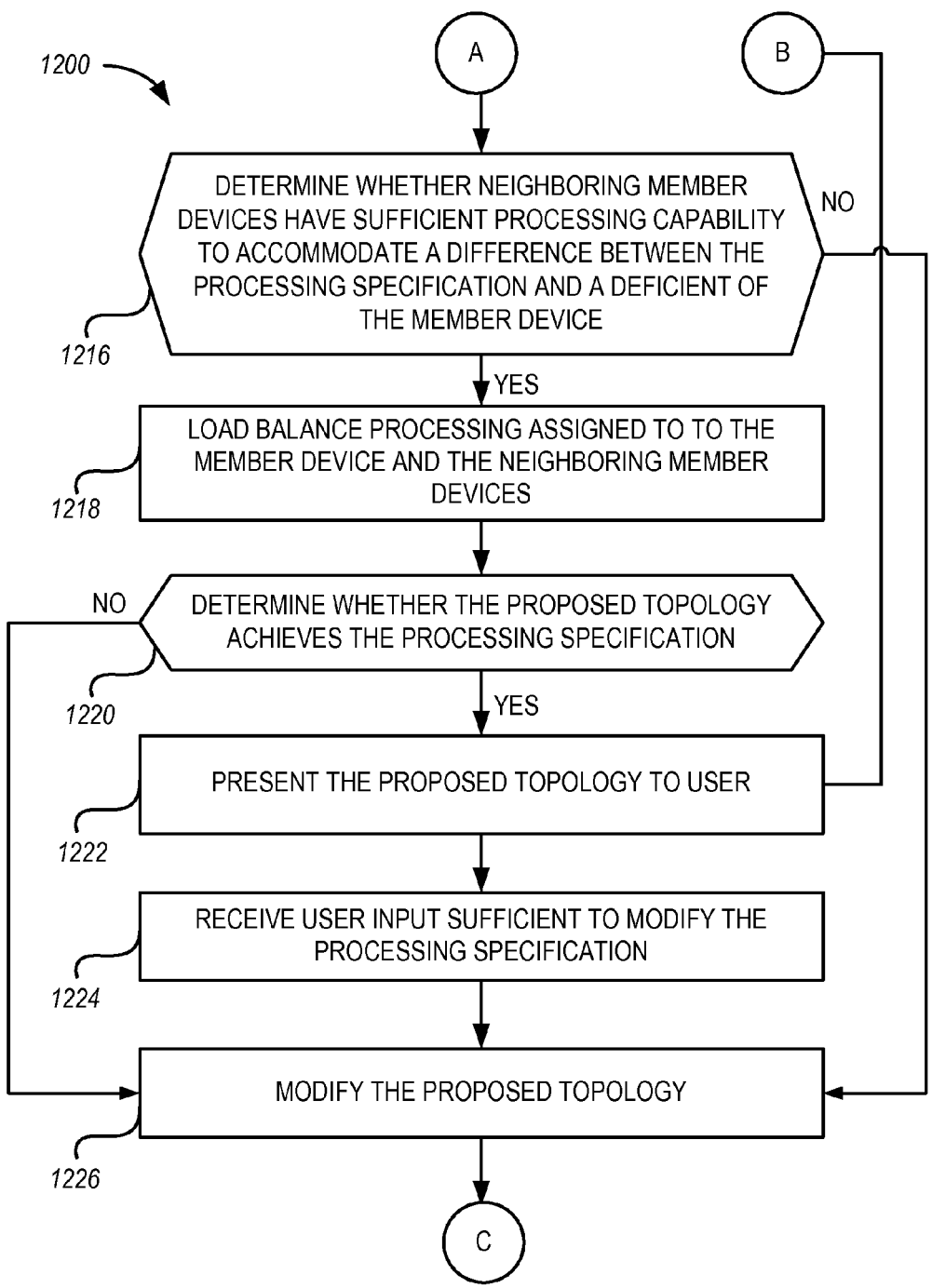

FIGS. 12A and 12B are a flow chart of an example method 1200 of array topology determination. The method 1200 may be programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform the method 1200. Additionally or alternatively, the computing device 320 may include the processor 328 described above that is configured to execute computer instructions to cause the topology/partitioning module 322 or another computing device to perform the method 1200. Although illustrated as discrete blocks, various blocks may be divided into additional blocks, combined into fewer blocks, or eliminated, depending on the desired implementation.

The method 1200 may begin at block 1202. At block 1202, proposed topology for an array of devices may be determined. In some embodiments, the proposed topology may be based on an estimated dataflow rate of the array. The estimated dataflow rate may be based on a processing specification that may be input from a user. Additionally or alternatively, the estimated dataflow rate may be estimated by an inherent or operating input and output rate for a set of source code applications. For example, some source code applications such as medical CT image processing may include a specified data rate per second, which may not be deviated from. Other source code applications may not include a strict dataflow rate.

At block 1204, parallel source code may be partitioned among member devices of the array. The member devices may include FPGA devices. In some embodiments, an initial partitioning of the parallel source code among the member devices of the array may be according to an initial set of segmented kernels. The initial set of segmented kernels may be a best guess as to a partition of the parallel source code to the member devices based on computational resources of the member devices and an estimate of an involved number and type of computations from initial read or parse of the parallel source code.

At block 1206, it may be determined whether to include additional code. The additional code may be added to replicate or broadcast or to communicate input or intermediate data between the member devices and/or to multiplex or demultiplex the input or intermediate data. In response to a determination to include the additional code ("Yes" at block 1206), the method 1200 may proceed to block 1208. In response to a determination not to include the additional code ("No" at block 1206), the method 1200 may proceed to block 1210. At block 1208, additional code may be generated. For example, the additional code may include repeaters, broadcast logic, FIFOs, pipes, multiplexers, demultiplexers, or some combination thereof.

At block 1210, it may be determined whether to include additional code to synchronize local dataflow and global dataflow. In response to a determination to include the additional code to synchronize local dataflow and global dataflow ("Yes" at block 1210), the method 1200 may proceed to block 1212. In response to a determination not to include the additional code to synchronize local dataflow and global dataflow ("No" at block 1210), the method 1200 may proceed to block 1214.

At block 1212, additional code to synchronize local dataflow and global dataflow may be generated. For example, the additional code may include a master synchronization kernel, a slave synchronization kernel, multiplexers, demultiplexers, code to communicate there between, or some combination thereof.

At block 1214, it may be determined whether each of the member devices is capable of achieving a processing specification. In response to a determination that the member devices are capable of achieving the processing specification ("Yes" at block 1214), the method may proceed to block 1222. In response to a determination that one of the member devices is not capable of achieving the processing specification ("No" at block 1214), the method may proceed to block 1216.

At block 1216, it may be determined whether neighboring member devices have sufficient processing capability to accommodate a difference between the processing specification and a deficiency of the member device. In response to a determination that the neighboring member devices do not have sufficient processing capability ("No" at block 1216), the method 1200 may proceed to block 1226. In response to a determination that the neighboring member devices have sufficient processing capability ("Yes" at block 1216), the method 1200 may proceed to block 1218.

At block 1218, processing assigned to the member device and the neighboring member devices may be load balanced. At block 1220, it may be determined whether the proposed topology achieves the processing specification. In response to a determination that the member devices are capable of achieving the processing specification ("Yes" at block 1220), the method 1200 may proceed to block 1222. In response to a determination that the member devices are not capable of achieving the processing specification ("No" at block 1220), the method 1200 may proceed to block 1226.

At block 1224, user input sufficient to modify the processing specification may be received. For example, a user such as the user 380 may input a new processing specification, which may serve at least partially as grounds for a modification to the proposed topology or as a change to a partitioning of the parallel source code.

At block 1226, the proposed topology of the array may be modified. For example, a row, a column, another array, etc. may be added to the proposed topology. From block 1224, the method 1200 may proceed to block 1204 and one or more of blocks 1206, 1208, 1210, 1212, 1214, 1216, 1218, 1220, and 1222 may be performed.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may comprise tangible computer-readable storage media including RAM, ROM, EEPROM, CD-ROM or other optical disk storage, magnetic disk storage or other magnetic storage devices, or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. An array of field programmable gate array (FPGA) devices configured for execution of a source code, the array comprising:
    two or more FPGA devices that are configured to execute a parallelized portion of the source code that is partitioned among the FPGA devices, wherein:
        the source code is partitioned based on data rates of computing elements of the source code, computational performance of the FPGA devices, and input/output (I/O) bandwidth of the FPGA devices,
        two or more of the FPGA devices include a memory bank that is addressable by a global memory address space for the array and includes an array interconnect configured to enable the computing elements that are executed by each of the FPGA devices to be programmed with a uniform address space of a global memory of the array and to enable utilization of the global memory by each of the FPGA devices,
        at least one of the FPGA devices includes a slave synchronization kernel that is configured to synchronize intermediate results between two or more of the computing elements, and
        one of the FPGA devices includes a master synchronization kernel that is configured with synchronization information that pertains to the slave synchronization kernel and to further synchronize the slave synchronization kernel with the other computing elements of the array;
    a host processor; and
    a host interface logic configure to connect the host processor with at least one of the FPGA devices.

2. The array of claim 1, wherein:
    at least one of the FPGA devices includes a pipe implemented between two or more of the computing elements of the source code, and the pipe is configured to control communication of intermediate results between the two or more of the computing elements.

3. The array of claim 1, wherein the source code is partitioned among the two or more FPGA devices such that there is a dominant dataflow direction in which execution of a portion of the computing elements are performed sequentially and a parallel process direction in which execution of the computing elements occur in parallel.

4. The array of claim 1, wherein the array interconnect is configured to control latency between the FPGA devices based on one or more selected cell sizes that are based directly on an amount of source data that an initiating load and store unit (LSU) in a first of the FPGA devices uses to communicate across the array interconnect and to replicate the access by a remote LSU at a destination FPGA device.

5. The array of claim 4, wherein:
the cell sizes are further based on access types of the initiating LSU and the remote LSU; and
the access types include atomic, burst, simple, and streaming.

6. The array of claim 1, wherein the array is arranged as:
a two-dimensional torus array;
a three-dimensional array;
an n-dimensional array;
a cluster including multiple host processors; or
a switched network interconnect.

7. An array of field programmable gate array (FPGA) devices configured for execution of a source code, the array comprising:
one or more host processors;
two or more FPGA devices configured to execute a parallelized portion of the source code that is partitioned among the FPGA devices, wherein:
the source code is partitioned based on data rates of computing elements of the source code, computational performance of the FPGA devices, and input/output (I/O) bandwidth of the FPGA devices, and
each of the FPGA devices includes a memory bank that is addressable by a global memory address space for the array and includes an array interconnect configured to enable the computing elements that are executed by each of the FPGA devices to be programmed with a uniform address space of a global memory of the array and to enable utilization of the global memory by each of the FPGA devices; and
one or more host interfaces that are configured to connect one of the host processor with one or more of the FPGA devices,
wherein:
the array interconnect is further configured to control latency between the FPGA devices based on one or more selected cell sizes that are based directly on an amount of source data that an initiating load and store unit (LSU) in a first of the FPGA devices uses to communicate across the array interconnect and to replicate the access by a remote LSU at a destination FPGA device and on access types of the initiating LSU and the remote LSU; and
the access types include one or more or a combination of atomic, burst, simple, and streaming.

8. The array of claim 7, wherein the array interconnect includes an adaptive router configured to choose a path of an incoming cell to a destination FPGA device.

9. The array of claim 8, wherein the adaptive router is configured to choose the path as a shortest path to the destination FPGA device unless the shortest path is congested and when the shortest path is congested, to determine based on historical data whether to choose a long path or to postpone transmission by a particular number of interconnect cycles.

10. The array of claim 7, wherein the array interconnect includes:
one or more out ports configured to communicate cells to one of the FPGA devices;
a pipe data hardware configured to generate a data cell, the data cell including status and control information among the FPGA devices;
a switch configured to route cells to the out ports; and
one or more multiplexers coupled between the pipe data hardware, the switch, and the out ports and configured to route the data cells to the out ports.

11. The array of claim 10, wherein the array interconnect includes:
an adaptive router;
one or more in ports coupled to the adaptive router, the in ports configured to receive incoming cells;
one or more dedicated data cell in ports configured to receive the data cells;
one or more load and store unit (LSU) bus masters coupled to the adaptive router, wherein a number of LSU bus masters is equivalent to a number of the in ports and the LSU bus masters are configured to operate in parallel; and
one or more receive data pipes coupled to the adaptive router and to the dedicated data cell in ports, wherein a number of receive data pipes is equivalent to the number of the in ports and a number of dedicated data cell in ports.

12. The array of claim 7, wherein:
the array interconnect includes two arbiters, a local store in port, a local load in port, a global in port, and a second level arbiter;
the two arbiters are configured to arbitrate load units and store units (LSU) based at least partially on the priority assignments of access types of the LSU and to communicate cells representative of the LSU to the local load in port and the local store in port;
the local load in port and the local store in port are configured to communicate the cells to the second level arbiter; and
the global in port is configured to receive cells from other FPGA devices and communicate the cells to the second level arbiter.

13. A method of array topology determination, the method comprising:
determining a proposed topology for an array of field programmable gate array (FPGA) devices based on an estimated dataflow rate;
partitioning parallel source code among FPGA devices of the proposed topology for the array;
determining whether each of the FPGA devices is capable of achieving a processing specification;
in response to a determination that one of the FPGA devices is not capable of achieving the processing specification, determining whether neighboring FPGA devices have sufficient processing capability to accommodate a difference between the processing specification and a deficiency of the FPGA device;
in response to a determination that the neighboring FPGA devices have sufficient processing capability, load balancing processing assigned to the FPGA device and the neighboring FPGA devices and determining whether the proposed topology achieves the processing specification;

in response to a determination that the FPGA devices are capable of achieving the processing specification and in response to a determination that the proposed topology achieves the processing specification, presenting the proposed topology to a user; and in response to a determination that the neighboring FPGA devices have insufficient processing capability and in response to a determination that the proposed topology does not achieve the processing specification, modifying the proposed topology for the array.

14. The method of claim 13, further comprising:
receiving user input sufficient to modify the processing specification;
modifying the proposed topology of the array; and
re-partitioning the parallel source code among FPGA devices of an array formed according to the modified proposed topology.

15. The method of claim 13, wherein the processing specification includes one or more of:
a number of packets per second arriving at a network node,
a number of packets leaving a network node,
a number of parallel data storage interfaces that are concurrently active,
an instantaneous bit-rate of a storage data stream,
an amount of data per second at an input to the array, and
a speed at which an answer is required to be derived.

16. The method of claim 13, further comprising:
determining whether to include additional code to replicate or communicate input or intermediate data between the FPGA devices;
in response to a determination to include the additional code to replicate or communicate input or intermediate data, generating additional code to replicate or communicate the input or intermediate data;
determining whether to include additional code to synchronize local dataflow and global dataflow; and
in response to a determination to include additional code to synchronize local dataflow and global dataflow, generating additional code to synchronize local dataflow and global dataflow.

17. The method of claim 13, wherein:
the array includes FPGA devices arranged in a dataflow direction in which data is processed sequentially in the array and a parallel process direction; and
the partitioning the parallel source code includes:
reading a parallel source code line-by-line;
based on the proposed topology, defining a device logic applicable to the FPGA devices included in the proposed topology;
partitioning the parallel source code in accordance with the proposed topology analyzed in the parallel process direction;
vectorizing one or more kernels to optimize a device arrangement of the proposed topology in the dataflow direction based on a utilization of FPGA device resources of the proposed topology; and
saving an optimized kernel file and a proposed topology file.

18. The method of claim 17, wherein the partitioning parallel source code in accordance with the proposed topology analyzed in the parallel process direction includes:
parsing the source code to identify iteration loops;
in response to one or more iteration loops being present in the source code, unrolling the identified iteration loops;
in response to there not being any iteration loops, choosing a maximum number of parallel kernels based on a number of devices in the parallel process direction of the proposed topology and a size address space of a memory expansion protocol implemented in the proposed topology; and
replicating kernel hardware.

19. The method of claim 17, wherein the vectorizing includes:
iterating a number of work items and iterating a number of compute units;
taking into consideration the defined device logic, determining whether resources of a FPGA devices of the proposed topology are utilized;
in response to the device resources not being fully utilized, reiterating the number of work items and/or the number of compute units;
in response to the resources being fully utilized, determining whether the kernel is too large to be executed by the FPGA device;
in response to the FPGA device having capability to process the kernel, including the number of work items and the number of compute units for the kernel in the optimized kernel file;
in response to the kernel being too large, splitting the kernel into two or more segmented kernels;
determining whether to include a storage element to communicate data between the segmented kernels;
in response to a determination to include the storage element, adding the storage element to the proposed topology; and
in response to a determination not to include the storage element, reiterating the number of work items and/or the number of compute units.

20. The method of claim 17, wherein:
the proposed topology file includes device array address indexing information utilized for modifications of a host processor code; and
the device logic includes one or more of a peripheral component interconnect express (PCIe) endpoint, an optical transport network (OTN) framer, a traffic manager, a user datagram protocol (UDP) stack, a transmission control protocol (TCP) stack, a packet forwarding protocol, and a frame forwarding protocol.

21. A non-transitory computer-readable medium having encoded therein programming code executable by a processor to perform operations of claim 13.

* * * * *